US010356908B2

(12) United States Patent
Hattori et al.

(10) Patent No.: US 10,356,908 B2
(45) Date of Patent: Jul. 16, 2019

(54) ELECTRONIC COMPONENT CONTAINING SUBSTRATE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Masaru Takahashi, Nagaokakyo (JP); Choichiro Fujii, Nagaokakyo (JP); Hirobumi Adachi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/444,425

(22) Filed: Feb. 28, 2017

(65) Prior Publication Data

US 2017/0171980 A1 Jun. 15, 2017

Related U.S. Application Data

(63) Continuation of application No. PCT/JP2015/073660, filed on Aug. 24, 2015.

(30) Foreign Application Priority Data

Sep. 1, 2014 (JP) .................................. 2014-176995
Sep. 10, 2014 (JP) .................................. 2014-184095

(Continued)

(51) Int. Cl.
*H05K 1/18* (2006.01)
*H01G 4/228* (2006.01)
(Continued)

(52) U.S. Cl.
CPC ............. *H05K 1/185* (2013.01); *H01G 4/224* (2013.01); *H01G 4/228* (2013.01); *H01G 4/232* (2013.01);
(Continued)

(58) Field of Classification Search
CPC ........ H05K 1/185; H01G 4/228; H01G 4/232; H01G 4/30; H01G 4/224
(Continued)

(56) References Cited

U.S. PATENT DOCUMENTS

2002/0089052 A1  7/2002  Yamaura et al.
2004/0066589 A1  4/2004  Togashi et al.
(Continued)

FOREIGN PATENT DOCUMENTS

JP      08-55752 A    2/1996
JP    2002-208668 A    7/2002
(Continued)

OTHER PUBLICATIONS

Official Communication issued in corresponding International Application PCT/JP2015/073660, dated Nov. 17, 2015.
(Continued)

*Primary Examiner* — Tremesha S Willis
(74) *Attorney, Agent, or Firm* — Keating & Bennett, LLP

(57) ABSTRACT

An electronic component containing substrate includes a substrate, a first electronic component mounted on a main surface of the substrate, and an embedment layer provided on the main surface of the substrate and embedding the first electronic component. The first electronic component is a multilayer ceramic capacitor including a ceramic multilayer body including a layered portion and a first side portion and a second side portion between which the layered portion lies and having two end surfaces opposed to each other and side surfaces connecting the two end surfaces to each other. The first side portion is located between the layered portion and the main surface of the substrate in a direction of thickness which is a direction perpendicular to the main surface of the substrate. The embedment layer is smaller in elastic modulus than the substrate.

14 Claims, 29 Drawing Sheets

(30) Foreign Application Priority Data

| Nov. 4, 2014 | (JP) | ................................ 2014-224733 |
| Nov. 20, 2014 | (JP) | ................................ 2014-235402 |
| Aug. 5, 2015 | (JP) | ................................ 2015-155196 |

(51) Int. Cl.

| H01G 4/30 | (2006.01) |
| H05K 1/02 | (2006.01) |
| H01G 4/224 | (2006.01) |
| H01G 4/232 | (2006.01) |
| H01G 4/005 | (2006.01) |
| H01G 4/12 | (2006.01) |

(52) U.S. Cl.
CPC ............. *H01G 4/30* (2013.01); *H05K 1/0271* (2013.01); *H01G 4/005* (2013.01); *H01G 4/12* (2013.01); *H05K 2201/0133* (2013.01); *H05K 2201/10015* (2013.01); *H05K 2201/10378* (2013.01)

(58) Field of Classification Search
USPC ........................................................ 174/260
See application file for complete search history.

(56) References Cited

U.S. PATENT DOCUMENTS

| 2008/0218937 A1 | 9/2008 | Kehoe |
| 2012/0000699 A1 | 1/2012 | Inoue |
| 2012/0138350 A1 | 6/2012 | Chae et al. |
| 2013/0050957 A1* | 2/2013 | Ogawa .................. H05K 1/186 361/728 |
| 2013/0056252 A1* | 3/2013 | Fujii ........................ H05K 1/16 174/260 |
| 2013/0058055 A1 | 3/2013 | Yamamoto |

FOREIGN PATENT DOCUMENTS

| JP | 2002-232110 A | 8/2002 |
| JP | 2004-134430 A | 4/2004 |
| JP | 2010-225620 A | 10/2010 |
| JP | 2012-094671 A | 5/2012 |
| JP | 2012-119660 A | 6/2012 |
| JP | 2013-065820 A | 4/2013 |
| WO | 2008/155967 A1 | 12/2008 |
| WO | 2010/150522 A1 | 12/2010 |
| WO | 2011/135926 A1 | 11/2011 |
| WO | 2011/148615 A1 | 12/2011 |

OTHER PUBLICATIONS

Fujita, "Multilayer Capacitor Built-In Substrate,", U.S. Appl. No. 15/830,233, filed Dec. 4, 2017.

Official Communication issued in corresponding Japanese Patent Application No. 2015-155196, dated Jul. 3, 2018.

\* cited by examiner

RELATION BETWEEN THICKNESS $T_R$ OF EMBEDMENT LAYER AND SOUND PRESSURE (SOUND PRESSURE IN L DIRECTION)

INTERNAL ELECTRODE BEING IN PARALLEL TO SUBSTRATE
THICKNESS $T_B$ OF SUBSTRATE 0.3mm
ELASTIC MODULUS $E_B$ OF SUBSTRATE 20GPa
HEIGHT $T_C$ OF CENTER OF CAPACITANCE GENERATION PORTION 0.315mm

ELECTRONIC COMPONENT CONTAINING SUBSTRATE

CROSS REFERENCE TO RELATED APPLICATIONS

This application claims the benefit of priority to Japanese Patent Application No. 2014-176995 filed on Sep. 1, 2014, Japanese Patent Application No. 2014-184095 filed on Sep. 10, 2014, Japanese Patent Application No. 2014-224733 filed on Nov. 4, 2014, Japanese Patent Application No. 2014-235402 filed on Nov. 20, 2014, Japanese Patent Application No. 2015-155196 filed on Aug. 5, 2015 and is a Continuation application of PCT Application No. PCT/JP2015/073660 filed on Aug. 24, 2015. The entire contents of each application are hereby incorporated herein by reference.

BACKGROUND OF THE INVENTION

1. Field of the Invention

The present invention relates to an electronic component containing substrate including a substrate, an electronic component mounted on a main surface of the substrate, and an embedment layer embedding the electronic component.

2. Description of the Related Art

With decreases in thicknesses of portable electronic devices, an electronic component containing substrate aiming to achieve a smaller thickness of a substrate by embedding an electronic component in the substrate has recently been proposed as seen in International Publication WO2011/135926.

FIG. 44 is a cross-sectional view of an electronic component containing substrate 100 described in International Publication WO2011/135926. In electronic component containing substrate 100 shown in FIG. 44, electronic components 101 and 102 are mounted on a substrate 108 and an embedment layer 109 embedding electronic components 101 and 102 is formed.

Since such electronic component containing substrate 100 is light in weight and does not involve firing at a high temperature like a ceramic substrate, restriction imposed on a contained electronic component is advantageously little.

A multilayer ceramic capacitor as electronic components 101 and 102 embedded in embedment layer 109 of electronic component containing substrate 100 described in International Publication WO2011/135926 is discussed. FIG. 45 shows a cross-sectional view of a multilayer ceramic capacitor 201.

Multilayer ceramic capacitor 201 includes a ceramic multilayer body 202 and a first external electrode 203 and a second external electrode 204 provided on a surface of ceramic multilayer body 202. Ceramic multilayer body 202 is obtained by connecting in parallel and layering capacitor elements, each capacitor element including a first internal electrode 206 and a second internal electrode 207 with a ceramic dielectric layer 205 being interposed therebetween. Such multilayer ceramic capacitor 201 achieves high reliability and durability and can realize a large capacity with a small size.

In multilayer ceramic capacitor 201 achieving a large capacity with a small size, a ceramic material having a high dielectric constant basically composed of barium titanate is often used as a material for ceramic dielectric layer 205 forming ceramic multilayer body 202. When a voltage is applied to multilayer ceramic capacitor 201 including such ceramic multilayer body 202, distortion in accordance with magnitude of an applied voltage is produced in ceramic multilayer body 202 owing to an electrostriction effect and an inverse piezoelectric effect. Accordingly, ceramic multilayer body 202 repeats expansion in a direction of layering and contraction in a planar direction perpendicular to the direction of layering.

With a decrease in size and thickness of multilayer ceramic capacitor 201 in recent years, the intensity of an electric field applied to a dielectric is also higher and a degree of distortion in ceramic multilayer body 202 has also increased.

As shown in FIG. 46A, an example in which multilayer ceramic capacitor 201 is mounted on a substrate B with the use of a connection member S is discussed. When a voltage is applied to multilayer ceramic capacitor 201, as shown in FIG. 46B, distortion produced in ceramic multilayer body 202 vibrates substrate B secured to multilayer ceramic capacitor 201 through connection member S.

Such vibration of substrate B may cause an erroneous operation of an acceleration sensor when an acceleration sensor such as a shock sensor is mounted on substrate B.

When a frequency of the vibration is from 20 Hz to 20 kHz representing an audibility range, audible sound is recognized by human ears. This phenomenon is also called "acoustic noise," and with electronic devices becoming more silent, such a phenomenon has become a problem in design of a power supply circuit for various applications such as a notebook personal computer, a portable telephone, and a digital camera.

When multilayer ceramic capacitor 201 is mounted on substrate B with the use of connection member S as above and further embedded in the embedment layer as described in International Publication WO2011/135926, connection member S and the embedment layer may transmit distortion in ceramic multilayer body 202 to substrate B. In that case, aggravated vibration of substrate B described previously and louder audible sound are concerned.

SUMMARY OF THE INVENTION

Preferred embodiments of the present invention provide an electronic component containing substrate in which vibration is decreased and generation of audible sound due to the vibration thereof is prevented or decreased even when a voltage is applied to an electronic component in an embedment layer and distortion is produced in the electronic component.

According to a preferred embodiment of the present invention, in order to lessen vibration of a substrate and to prevent or lessen generation of audible sound due to the vibration even when a voltage is applied to an electronic component in an embedment layer and distortion is produced in the electronic component, an elastic modulus of the substrate is improved. Furthermore, according to a preferred embodiment of the present invention, in order to achieve the advantage described above, a relationship among a thickness of the substrate, a thickness of the embedment layer, and a height of the electronic component, arrangement of electronic components, or a shape of the embedment layer is improved.

An electronic component containing substrate according to a preferred embodiment of the present invention includes a substrate, a first electronic component mounted on a main surface of the substrate, and an embedment layer provided on the main surface of the substrate and embedding the first electronic component.

The first electronic component includes a multilayer ceramic capacitor including a ceramic multilayer body and an external electrode. The ceramic multilayer body includes a layered portion including a ceramic dielectric layer and an internal electrode which are alternately layered and a first side portion and a second side portion between which the layered portion lies and has two end surfaces opposed to each other and side surfaces connecting the two end surfaces to each other. The external electrode is connected to the internal electrode and provided on a surface of the ceramic multilayer body. The first side portion is located between the layered portion and the main surface of the substrate in a direction of thickness which is a direction perpendicular to the main surface of the substrate. The embedment layer is lower in elastic modulus than the substrate.

In the electronic component containing substrate, even when a voltage is applied to the first electronic component in the embedment layer and distortion is produced in the first electronic component, vibration of the substrate in an audible frequency range is decreased and generation of audible sound due to the vibration of the substrate is prevented or decreased. The audible frequency range herein refers to a frequency range from 20 Hz to 20 kHz as described previously.

An electronic component containing substrate according to a preferred embodiment of the present invention preferably includes features below. The electronic component containing substrate has a central plane in the direction of thickness located at a position where the central plane passes through the ceramic multilayer body.

The central plane of the electronic component containing substrate in the direction of thickness herein refers to a surface assumed such that a distance from one main surface of the electronic component containing substrate is equal to a distance from the other main surface thereof in the electronic component containing substrate.

In the electronic component containing substrate, even though distortion is produced in the first electronic component, portions above and under the central plane in the direction of thickness of the electronic component containing substrate mutually cancel vibrations. Therefore, vibration of the substrate in the audible frequency range is decreased and generation of audible sound due to the vibration of the substrate is prevented or decreased.

An electronic component containing substrate according to a preferred embodiment of the present invention preferably includes features below. In the direction of thickness, the first side portion of the ceramic multilayer body is greater in thickness than the second side portion.

According to the present preferred embodiment of the electronic component containing substrate, a distance between the layered portion and the substrate is able to be increased. In this case, adjustment of a relationship among a thickness of the substrate, a thickness of the embedment layer, and a height of the first electronic component is facilitated. The central plane of the electronic component containing substrate in the direction of thickness is more easily designed to be located at a position where it passes through the multilayer body. Therefore, lessening of vibration of the substrate in the audible frequency range is facilitated and prevention or lessening of generation of audible sound due to the vibration of the substrate is facilitated.

As described, for example, in Japanese Patent Laying-Open No. 2013-65820, by adjusting a relationship between a height from the substrate, of a top of a connection member for connecting the first electronic component to the substrate and a height of the layered portion, vibration of the substrate in the audible frequency range is able to further effectively be decreased.

An electronic component containing substrate according to a preferred embodiment of the present invention preferably includes the features below. The first electronic component further includes an electrode terminal connected to the external electrode, and the electrode terminal is connected to the substrate.

According to the present preferred embodiment of the electronic component containing substrate, a distance between the layered portion and the substrate is able to be increased, and adjustment of a relationship among a thickness of the substrate, a thickness of the embedment layer, and a height of the first electronic component is facilitated. Therefore, an effect the same as in the above-described preferred embodiment of the present invention is able to be obtained.

As described, for example, in Japanese Patent Laying-Open No. 2010-123614, by adjusting a shape of an electrode terminal, vibration of the substrate in the audible frequency range is able to further effectively be decreased.

An electronic component containing substrate according to a preferred embodiment of the present invention preferably includes also features below. The first electronic component further includes an interposer located between the first side portion and the substrate, and the interposer is connected to the substrate.

According to the present preferred embodiment of the electronic component containing substrate, a distance between the layered portion and the substrate is able to be increased, and adjustment of a relationship among a thickness of the substrate, a thickness of the embedment layer, and a height of the first electronic component is facilitated. Therefore, an effect the same in the above-described preferred embodiments of the present invention is able to be obtained.

As described, for example, in Japanese Patent Laying-Open No. 2012-204572, by defining a direction of connection of the multilayer ceramic capacitor to the interposer and structuring the interposer in a specific manner, vibration of the substrate in the audible frequency range is able to further effectively be decreased.

An electronic component containing substrate according to a preferred embodiment of the present invention preferably includes features below. In the direction of thickness, the central plane of the electronic component containing substrate is located between a central plane of the layered portion of the first electronic component and the second side portion of the ceramic multilayer body.

The central plane of the layered portion of the first electronic component in the direction of thickness herein refers to a surface assumed in the layered portion such that a distance from a side surface in parallel to and closest to the main surface of the substrate, of the layered portion of the first electronic component with the first electronic component being connected to the substrate is equal to a distance from a side surface thereof in parallel to and farthest from the main surface of the substrate. A central plane of the layered portion of the second electronic component in the direction of thickness which will be described later is also defined similarly to the above. Furthermore, being in parallel to the main surface of the substrate does not mean being strictly in parallel but refers to a state that a side surface includes projections and recesses or that a side surface is in such positional relationship that the side surface can macroscopically be regarded as being in parallel even though the side surface is slightly inclined.

In the present preferred embodiment of the electronic component containing substrate, the portions above and under the central plane of the electronic component containing substrate more effectively mutually cancel vibrations. Therefore, vibration of the substrate in the audible frequency range is reliably decreased and generation of audible sound due to the vibration of the substrate is reliably prevented or decreased.

An electronic component containing substrate according to a preferred embodiment of the present invention preferably includes also features below. An electronic component containing substrate according to a preferred embodiment of the present invention further includes a second electronic component mounted on the main surface of the substrate and embedded in the embedment layer.

The second electronic component includes a multilayer ceramic capacitor including a ceramic multilayer body and an external electrode. The ceramic multilayer body includes a layered portion including a ceramic dielectric layer and an internal electrode which are alternately layered and a pair of side portions between which the layered portion lies and has two end surfaces opposed to each other and side surfaces connecting the two end surfaces to each other. The external electrode is connected to the internal electrode and provided on a surface of the ceramic multilayer body.

The side surface of the ceramic multilayer body of the first electronic component and the side surface of the ceramic multilayer body of the second electronic component are opposed to each other with the embedment layer being interposed. In the direction of thickness which is the direction perpendicular to the main surface of the substrate, an interval between the central plane of the layered portion of the first electronic component and the main surface of the substrate is greater than an interval between a central plane of the layered portion of the second electronic component and the main surface of the substrate. In the direction of thickness, the central plane of the electronic component containing substrate is located between the central plane of the layered portion of the first electronic component and the central plane of the layered portion of the second electronic component.

According to the present preferred embodiment of the electronic component containing substrate, the central plane of the electronic component containing substrate is located on a side of the substrate relative to the central plane of the layered portion of the first electronic component and located on a side of an outer surface of the embedment layer relative to the central plane of the layered portion of the second electronic component.

When a voltage is applied to the first electronic component with the positional a relationship above being set, distortion produced in the first electronic component generates a bending moment as deforming the other main surface of the substrate to a recessed surface in a portion of the electronic component containing substrate on the side of the substrate relative to the central plane. When a voltage is applied to the second electronic component, distortion produced in the second electronic component generates a bending moment as deforming the outer surface of the embedment layer to a recessed surface in a portion of the electronic component containing substrate on the side of the outer surface of the embedment layer relative to the central plane.

With the central plane of the electronic component containing substrate being located at the position above, even when distortion is produced in the first electronic component and the second electronic component, the portion of the electronic component containing substrate on the side of the substrate relative to the central plane and the portion on the side of the outer surface of the embedment layer mutually cancel the bending moments, and consequently, vibrations due to deformation based on the bending moments are mutually canceled. Therefore, as the positional relationship between the central plane of the layered portion of each of the first electronic component and the second electronic component and the central plane of the electronic component containing substrate satisfies the condition above, vibration of the substrate in the audible frequency range is decreased and generation of audible sound due to the vibration of the substrate is prevented or decreased.

An electronic component containing substrate according to a preferred embodiment of the present invention preferably includes features below. In the direction of thickness, an interval between the central plane of the layered portion of the first electronic component and the central plane of the electronic component containing substrate is smaller than an interval between the central plane of the layered portion of the second electronic component and the central plane of the electronic component containing substrate.

For example, the first electronic component is greater in size in the direction of thickness than the second electronic component and is higher in degree of distortion at the time of application of a voltage than the second electronic component. Then, a bending moment generated in the portion of the electronic component containing substrate on the side of the substrate relative to the central plane is greater than a bending moment generated in the portion of the electronic component containing substrate on the side of the outer surface of the embedment layer relative to the central plane.

According to the present preferred embodiment of the electronic component containing substrate, in the direction of thickness, an interval between the central plane of the layered portion of the first electronic component and the central plane of the electronic component containing substrate is smaller than an interval between the central plane of the layered portion of the second electronic component and the central plane of the electronic component containing substrate. Then, balance between a bending moment as deforming the portion of the electronic component containing substrate on the side of the substrate relative to the central plane and a bending moment as deforming the portion of the electronic component containing substrate on the side of the outer surface of the embedment layer relative to the central plane is able to be effectively maintained.

The portion of the electronic component containing substrate on the side of the substrate relative to the central plane and the portion thereof on the side of the outer surface of the embedment layer effectively mutually cancel vibrations thereof due to deformation based on the bending moments. Therefore, as a positional relationship between the central plane of the layered portion of each of the first electronic component and the second electronic component and the central plane of the electronic component containing substrate satisfies the condition above, vibration of the substrate in the audible frequency range is further decreased and generation of audible sound due to the vibration of the substrate is effectively prevented or decreased.

An electronic component containing substrate according to a preferred embodiment of the present invention preferably includes also features below. An electronic component containing substrate according to a preferred embodiment of the present invention further includes a second electronic component mounted on the main surface of the substrate and embedded in the embedment layer.

The second electronic component includes a multilayer ceramic capacitor including a ceramic multilayer body and an external electrode. The ceramic multilayer body includes a layered portion including a ceramic dielectric layer and an internal electrode which are alternately layered and a pair of side portions between which the layered portion lies and includes two end surfaces opposed to each other and side surfaces connecting the two end surfaces to each other. The external electrode is connected to the internal electrode and provided on a surface of the ceramic multilayer body.

The side surface of the ceramic multilayer body of the first electronic component and the side surface of the ceramic multilayer body of the second electronic component are opposed to each other with the embedment layer being interposed. A direction of layering of the ceramic dielectric layer and the internal electrode in the ceramic multilayer body of the first electronic component is perpendicular to a direction of layering of the ceramic dielectric layer and the internal electrode in the ceramic multilayer body of the second electronic component.

According to the present preferred embodiment of the electronic component containing substrate, when a voltage is applied to each electronic component, vibration produced as a result of transmission of distortion produced in the first electronic component to the embedment layer and vibration produced as a result of transmission of distortion produced in the second electronic component to the embedment layer cancel each other.

Even when distortion due to application of a voltage is produced in each electronic component embedded in the embedment layer, transmission of vibration through the embedment layer is able to be decreased. Therefore, by arranging the first electronic component and the second electronic component as above on a circuit of the electronic component containing substrate, vibration of the substrate in the audible frequency range is decreased and generation of audible sound due to the vibration of the substrate is prevented or decreased.

An electronic component containing substrate according to a preferred embodiment of the present invention preferably includes features below. The first electronic component and the second electronic component are directly connected to each other through a conductive pattern. The first electronic component and the second electronic component may be connected to each other in parallel or in series.

According to the present preferred embodiment of the electronic component containing substrate, voltages applied to the first electronic component and the second electronic component are in phase or substantially in phase. Vibration produced as a result of transmission of distortion produced in the first electronic component to the embedment layer and vibration produced as a result of transmission of distortion produced in the second electronic component to the embedment layer reliably cancel each other. Therefore, by arranging the first electronic component and the second electronic component as above on a circuit of the electronic component containing substrate, vibration of the substrate in the audible frequency range is reliably decreased and generation of audible sound due to the vibration of the substrate is prevented or decreased.

An electronic component containing substrate according to a preferred embodiment of the present invention includes features below. With the main surface of the substrate being defined as a reference surface, a height of a center of the layered portion of the first electronic component is intermediate between a height of a lowest portion and a height of a highest portion of the layered portion of the second electronic component and a height of a center of the layered portion of the second electronic component is intermediate between a height of a lowest portion and a height of a highest portion of the layered portion of the first electronic component.

A height of the lowest portion and a height of the highest portion of the layered portion of the first electronic component with the main surface of the substrate being defined as the reference surface herein refer to a height of a portion smallest in height from the main surface of the substrate and a height of a portion greatest in height, of the layered portion of the first electronic component while the first electronic component is connected to the substrate. A height of the lowest portion and a height of the highest portion of the layered portion of the second electronic component are also defined similarly to the above.

According to the present preferred embodiment of the electronic component containing substrate, vibration produced as a result of transmission of distortion produced in the first electronic component to the embedment layer and vibration produced as a result of transmission of distortion produced in the second electronic component to the embedment layer effectively interfere with each other without passing by each other.

Vibrations produced as a result of transmission of distortion produced in electronic components to the embedment layer reliably cancel each other. Therefore, by arranging the first electronic component and the second electronic component as above on a circuit of the electronic component containing substrate, vibration of the substrate in the audible frequency range is reliably decreased and generation of audible sound due to the vibration of the substrate is prevented or decreased.

An electronic component containing substrate according to a preferred embodiment of the present invention preferably includes also features below. A surface of the embedment layer includes a recess portion.

According to the present preferred embodiment of the electronic component containing substrate, since the outer surface of the embedment layer includes the recess portion, the recess portion suppresses transmission of vibration of the first electronic component through the embedment layer. Consequently, great vibration of the electronic component containing substrate in the audible frequency range is suppressed. Therefore, vibration of the substrate in the audible frequency range produced as a result of distortion in the first electronic component at the time of application of a voltage is decreased and generation of audible sound due to the vibration of the substrate is prevented or decreased.

An electronic component containing substrate according to a preferred embodiment of the present invention preferably includes features below. The recess portion is provided to lessen vibration of the substrate in the audible frequency range which occurs with distortion in the first electronic component caused by application of a voltage.

According to the present preferred embodiment of the electronic component containing substrate, the recess portion effectively suppresses transmission of vibration of the first electronic component through the embedment layer. Consequently, great vibration of the substrate in the audible frequency range is effectively suppressed. Therefore, vibration of the substrate in the audible frequency range produced as a result of distortion in the first electronic component at the time of application of a voltage is further suppressed and generation of audible sound due to the vibration of the substrate is further prevented or decreased.

An electronic component containing substrate according to a preferred embodiment of the present invention preferably includes features below. The recess portion includes a lowest portion located lower than a center of the layered portion of the first electronic component, with the main surface of the substrate being defined as the reference surface.

A height of the lowest portion of the recess portion with the main surface of the substrate being defined as the reference surface herein refers to a height of a portion at the bottom of the recess portion where a height from the main surface of the substrate is smallest.

According to the present preferred embodiment of the electronic component containing substrate, since the lowest portion of the recess portion is located lower than the center of the layered portion of the first electronic component, a portion of the embedment layer which significantly deforms is isolated from other portions and transmission of vibration of the first electronic component through the embedment layer can more effectively be suppressed. Therefore, vibration of the substrate produced as a result of distortion in the first electronic component at the time of application of a voltage is reliably decreased and generation of audible sound due to the vibration of the substrate is reliably prevented or decreased.

An electronic component containing substrate according to a preferred embodiment of the present invention preferably include features below. The recess portion further includes an inserted member being higher in elastic modulus than the embedment layer and occupying at least a part of a volume of the recess portion.

According to the present preferred embodiment of the electronic component containing substrate, the recess portion includes an inserted member being higher in elastic modulus than the embedment layer and occupying at least a portion of a volume of the recess portion. Therefore, a waveform of vibration of the first electronic component transmitted through the embedment layer is disturbed by a portion of the inserted member.

Transmission of vibration of the first electronic component through the embedment layer is able to be more effectively be suppressed. Therefore, vibration of the substrate produced as a result of distortion in the first electronic component at the time of application of a voltage is reliably decreased and generation of audible sound due to the vibration of the substrate is reliably prevented or decreased.

Since the inserted member higher in elastic modulus than the embedment layer is inserted in the recess portion, a thickness of the embedment layer which has partially decreased is able to be closer to a state that no recess is provided. Therefore, resistance to moisture or rigidity of the electronic component containing substrate is able to be improved from a state that a recess portion is simply provided.

According to electronic component containing substrates according to preferred embodiments of the present invention, even when a voltage is applied to the first electronic component in the embedment layer and distortion is produced in the first electronic component, vibration of the substrate in the audible frequency range is decreased and generation of audible sound due to the vibration of the substrate is prevented or decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Features of this invention will be described below in further detail with reference to preferred embodiments of the present invention

First Preferred Embodiment

An electronic component containing substrate 1 according to a first preferred embodiment of the present invention will be described with reference to FIGS. 1 to 4.

Figure 1:
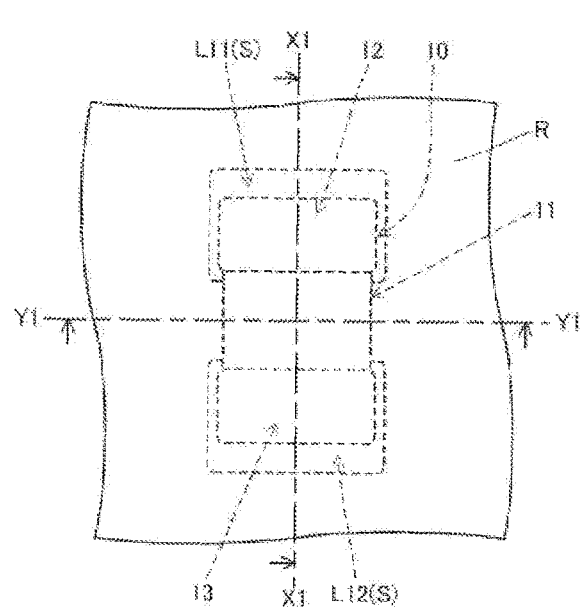
FIG. 1 is a top view of an electronic component containing substrate 1 according to a first preferred embodiment of the present invention.
Figure 2A:
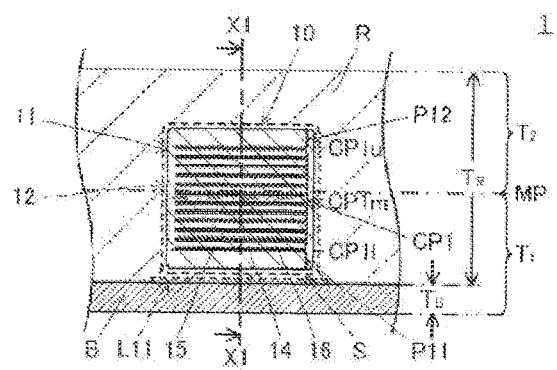
FIGS. 2A and 2B are cross-sectional views of the electronic component containing substrate 1 shown in FIG. 1, with FIG. 2A showing a cross-sectional view along a surface including the line Y1-Y1 in FIG. 1 and FIG. 2B showing a cross-sectional view along a surface including the line X1-X1 in FIG. 1.
Figure 2B:
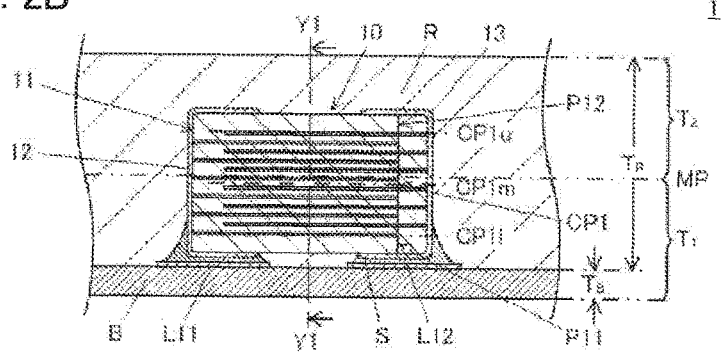

FIG. 1 is a top view of electronic component containing substrate 1. FIG. 2A is a cross-sectional view along a surface including the line Y1-Y1 in FIG. 1. FIG. 2B is a cross-sectional view along a surface including the line X1-X1 in FIG. 1.

Electronic component containing substrate 1 includes a substrate B, a first electronic component 10, and an embedment layer R. First electronic component 10 is mounted on one main surface of substrate B having one main surface and the other main surface substantially in parallel to each other. Embedment layer R is formed of a resin material in which a glass material or silica is dispersed as a filler as will be described later. Embedment layer R is provided on one main surface of substrate B so as to embed first electronic component 10. Embedment layer R is lower in elastic modulus than substrate B. Embedment layer R may include a resin material portion and a conductive material portion provided on a surface thereof as in FIG. 3 which will be described later.

Figure 44:
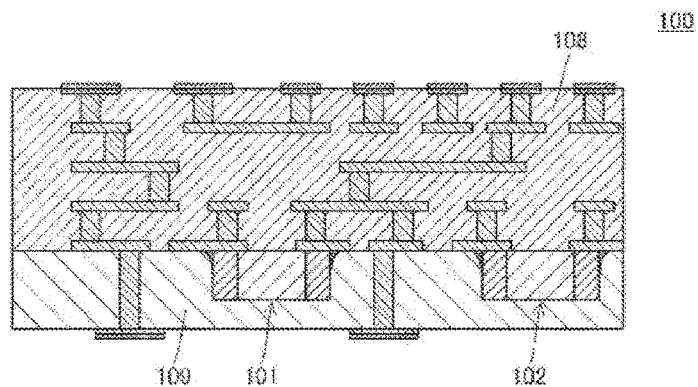
FIG. 44 is a cross-sectional view of an electronic component containing substrate 100 representing the background art.
Figure 45:
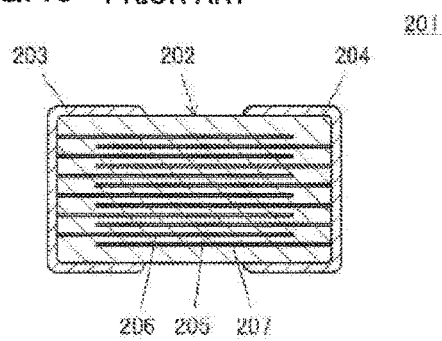
FIG. 45 is a cross-sectional view of a multilayer ceramic capacitor 201 for illustrating a problem to be solved by preferred embodiments of the present invention.

Substrate B is a multilayer substrate corresponding to FIG. 44 described previously, and it is shown in a simplified manner with an internal electrode or a via not being shown. Substrate B includes an insulating layer and an interconnection layer as in the multilayer substrate shown in FIG. 44. The insulating layer contains a woven fabric or a nonwoven fabric of glass, silica, or the like and an insulating resin. In a preferred embodiment of the present invention, in order to emphasize first electronic component 10, a relationship in magnitude between substrate B and first electronic component 10 is different from an actual state.

First electronic component 10 includes a multilayer ceramic capacitor including a ceramic multilayer body 11 and a first external electrode 12 and a second external electrode 13. Ceramic multilayer body 11 includes a layered portion CP1 and a first side portion P11 and a second side portion P12 between which layered portion CP1 lies. Layered portion CP1 corresponds to what is called a capacitance generation portion in which capacitor elements each having a ceramic dielectric layer 14 interposed between a first internal electrode 15 and a second internal electrode 16 are layered. First side portion P11 and second side portion P12 correspond to what is called a first protection portion and a second protection portion, respectively, which protect layered portion CP1 against an external environment. Ceramic multilayer body 11 has two opposing end surfaces and side surfaces connecting the two end surfaces to each other.

A direction perpendicular to one main surface of substrate B is defined as a direction of thickness of electronic component containing substrate 1. Based on such definition, a lowermost surface in the direction of thickness of layered portion CP1 of first electronic component 10 mounted on substrate B, that is, a side surface in parallel to one main surface of substrate B and closest to substrate B, is defined as a lowermost surface CP1l. An uppermost surface in the direction of thickness of layered portion CP1, that is, a side surface in parallel to one main surface of substrate B and farthest from substrate B, is defined as an uppermost surface CP1u. Then, a central plane which passes through the center between lowermost surface CP1l and uppermost surface CP1u is denoted as CP1m.

The side surface being in parallel to one main surface of substrate B does not mean being strictly in parallel but refers to positional a relationship which can macroscopically be regarded as parallel even when a side surface includes projections and recesses or a side surface is slightly inclined.

In the first preferred embodiment, first electronic component 10 is mounted on substrate B such that a direction of layering which is a direction in which capacitor elements of ceramic multilayer body 11 are layered is perpendicular to one main surface of substrate B. In the direction of thickness, a lower side of layered portion CP1 of ceramic multilayer body 11, that is, a portion located between layered portion CP1 and one main surface of substrate B, is defined as first side portion P11 and an upper side of layered portion CP1 is defined as second side portion P12.

Figure 3:
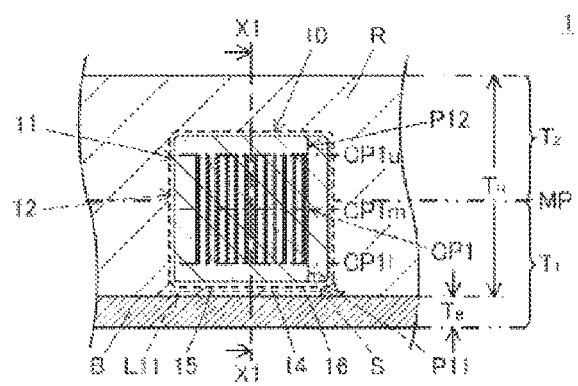
FIG. 3 is a cross-sectional view corresponding to FIG. 2A for illustrating an example in which a direction of mounting of a first electronic component 10 is varied in electronic component containing substrate 1 shown in FIG. 1.

In electronic component containing substrate 1, as shown in FIG. 3, first electronic component 10 may be mounted on substrate B such that the direction of layering of ceramic multilayer body 11 is along one main surface of substrate B. FIG. 3 corresponds to a cross-sectional view along a surface including the line Y1-Y1 in FIG. 1 (FIG. 2A).

In this case as well, the lower side of layered portion CP1 in ceramic multilayer body 11 in the direction of thickness, that is, the portion located between layered portion CP1 and one main surface of substrate B, is defined as first side portion P11 and the upper side of layered portion CP1 is defined as second side portion P12.

As ceramic dielectric layer 14 has electrostriction or an inverse piezoelectric effect, distortion is produced in first electronic component 10 including ceramic dielectric layer 14 at the time of application of a voltage. Examples of representative ceramic materials having electrostriction or an inverse piezoelectric effect include a ceramic material high in dielectric constant basically composed of barium titanate.

Though a multilayer ceramic capacitor is exemplified as first electronic component 10 in the first preferred embodiment, preferred embodiments of the present invention are also applicable to examples in which a layered metallized film capacitor representing a layered capacitor including a dielectric layer composed of a resin material is used as first electronic component 10.

Ceramic multilayer body 11 includes two end surfaces opposed to each other and side surfaces connecting the two end surfaces to each other. First external electrode 12 is connected to first internal electrode 15 and second external electrode 13 is connected to second internal electrode 16. First external electrode 12 and second external electrode 13 are provided on a surface of ceramic multilayer body 11.

In FIGS. 2A and 2B, first electronic component 10 is connected on a first mounting land L11 and a second mounting land L12, for example, with a connection member S such as solder. A material for first mounting land L11 and second mounting land L12 and a material for the connection member can be selected as appropriate from existing materials for use. For example, a conductive adhesive or a via conductor can be used as a connection member other than solder. First mounting land L11 and second mounting land L12 are on an interconnection including a not-shown conductive pattern. A voltage is applied to first electronic component 10 through this interconnection.

A plurality of first electronic components 10 may be mounted on electronic component containing substrate 1 so long as suppression of vibration of electronic component containing substrate 1 based on adjustment of a thickness of substrate B, a thickness of embedment layer R, and a height of first electronic component 10 is not affected. Similarly, an electronic component other than a multilayer ceramic capacitor may be mounted on electronic component containing substrate 1.

Since a ceramic material high in dielectric constant basically composed of barium titanate is often used, first electronic component 10 including a multilayer ceramic capacitor as described previously may vibrate due to distortion caused at the time of application of a voltage. Though vibration is transmitted to substrate B secured to first electronic component 10 through connection member S, vibration is transmitted to substrate B also through embedment layer R when first electronic component 10 is embedded in embedment layer R.

Though embedment layer R functions as a medium of transmission of distortion, embedment layer R is lower in elastic modulus than substrate B. Therefore, embedment layer R buffers transmission of distortion. Consequently, vibration of substrate B is decreased as compared with an example in which embedment layer R is equal to or higher than substrate B in elastic modulus.

A thickness of electronic component containing substrate 1 is expressed as the sum of a thickness $T_B$ of substrate B and a thickness $T_R$ of embedment layer R. A central plane MP of electronic component containing substrate 1 in the direction of thickness is defined as a surface assumed such that a distance $T_1$ from one main surface of electronic component containing substrate 1 (an outer surface of substrate B) is equal to a distance $T_2$ from the other main surface thereof (the outer surface of embedment layer R).

In electronic component containing substrate 1, in the direction of thickness, first side portion P11 is located between layered portion CP1 and one main surface of substrate B. Central plane MP of the electronic component containing substrate in the direction of thickness is located at a position where the central plane passes through layered portion CP1.

When central plane MP in the direction of thickness of electronic component containing substrate 1 is located at a position where it passes through layered portion CP1, portions above and under central plane MP in the direction of thickness of electronic component containing substrate 1 mutually cancel vibrations even when distortion is produced in first electronic component 10.

Electronic component containing substrate 1 vibrates because an end surface of first electronic component 10 distorted by application of a voltage produces a moment as bending electronic component containing substrate 1. When central plane MP is located at a position where it passes through layered portion CP1, a moment applied to the portion above central plane MP of electronic component containing substrate 1 and a moment applied to the portion under the same are opposite in orientation and close to each other in magnitude.

The moment applied to the portion above central plane MP and the moment applied to the portion under the same cancel each other. Therefore, it is estimated that the portions above and under central plane MP mutually cancel vibrations and production of vibration in electronic component containing substrate 1 is suppressed.

Figure 4:
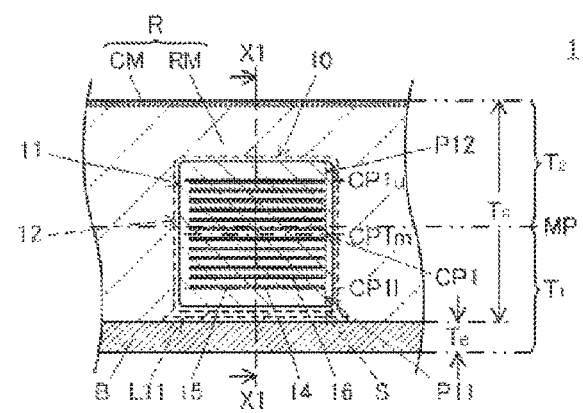
FIG. 4 is a cross-sectional view corresponding to FIG. 2A for illustrating an example in which an embedment layer R includes a resin material portion RM and a conductive material portion CM provided on a surface thereof in electronic component containing substrate 1 shown in FIG. 1.

As shown in FIG. 4, embedment layer R may be formed to include resin material portion RM and conductive material portion CM provided on a surface thereof. FIG. 4 corresponds to a cross-sectional view along the surface including the line Y1-Y1 in FIG. 1 (FIG. 2A).

As will be described later, resin material portion RM can be formed, for example, by using an insulating resin material in which a glass material or silica is dispersed as a filler. Conductive material portion CM can be formed, for example, with what is called a thin film formation method such as application of a conductive resin material or sputtering of a metal material. In this case, an outer surface of conductive material portion CM is defined as the other main surface of electronic component containing substrate 1. Therefore, a position of central plane MP of electronic component containing substrate 1 in the direction of thickness is also accordingly determined.

Figure 5:
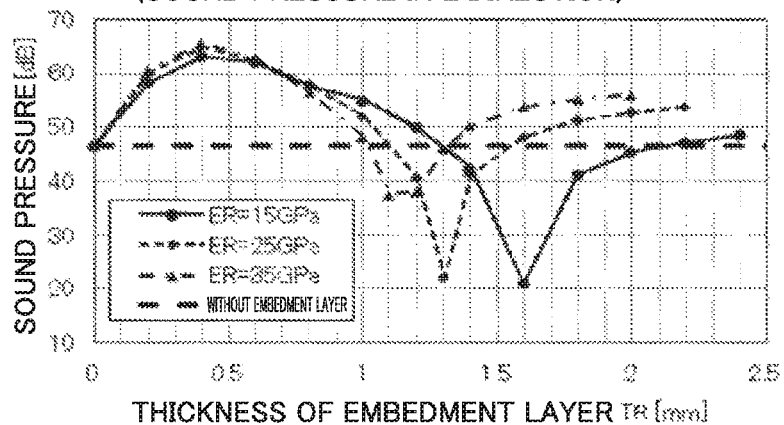
FIG. 5 is a graph showing a result of finding through simulation, a relationship between a thickness of embedment layer R provided in electronic component containing substrate 1 shown in FIG. 1 and a sound pressure.

Mutual cancellation of vibrations by the portions above and under central plane MP when central plane MP of electronic component containing substrate 1 is located at a position where it passes through layered portion CP1 was verified through simulation based on a finite-element method. FIG. 5 is a graph showing relationship between thickness $T_R$ of the embedment layer provided on one main surface of substrate B and a sound pressure corresponding to magnitude of vibration (a result of conversion of largest amplitude of vibration produced in an audibility range to a sound volume).

A sound pressure represents a volume of sound (what is called "acoustic noise") generated in an L direction of first electronic component 10 (a direction horizontal to substrate B in FIG. 2B). In simulation, first electronic component 10 is assumed to be mounted such that first internal electrode 15 and second internal electrode 16 are in parallel to substrate B.

Layered portion CP1 of first electronic component 10 (the multilayer ceramic capacitor) preferably has a thickness in the direction of layering of about 0.47 mm, first side portion P11 preferably has a thickness of about 0.04 mm, and second side portion P12 has a thickness of about 0.04 mm, for example. Substrate B preferably has a thickness $T_B$ of about 0.8 mm and an elastic modulus $E_B$ of 20 GPa, and a height of a central plane CPm in the direction of layering of layered portion CP1 with one main surface of substrate B being defined as the reference surface is about 0.315 mm, for example.

A value considered as reasonable as an elastic modulus (a bending elastic modulus) of a generally used glass epoxy substrate is adopted as elastic modulus $E_B$ of substrate B. Variation in sound pressure with variation in thickness $T_R$ of embedment layer R was calculated, with first electronic component 10 being embedded in embedment layer R having a length in an L direction of about 24 mm, for example.

FIG. 5 shows three simulation results obtained from examples in which elastic modulus $E_R$ of embedment layer R was set to 15 GPa, 25 GPa, and 35 GPa. Initially, attention was paid to thickness $T_R$ of embedment layer R at which substrate B and a second portion $R_2$ of embedment layer R mutually canceled vibrations and a sound pressure attained to the relative minimum. When elastic modulus $E_R$ of embedment layer R was set to each value above, thickness $T_R$ of embedment layer R at which a sound pressure attained to the relative minimum was about 1.6 mm, about 1.3 mm, and about 1.15 mm, for example.

When embedment layer R has elastic modulus $E_R$ of 15 GPa, the thickness of electronic component containing substrate 1 is about 2.4 mm, for example, which is the sum of thickness $T_B$ of substrate B and thickness $T_R$ of embedment layer R. Therefore, a height of central plane MP in the direction of thickness of electronic component containing substrate 1 with one main surface of substrate B being defined as the reference surface is about (2.4/2)−0.8=about 0.4 mm, for example.

A height of lowermost surface CP1*l* in the direction of layering of layered portion CP1 with one main surface of substrate B being defined as the reference surface preferably is about 0.315−(0.47/2)=about 0.08 mm, because a height of central plane CP1*m* of layered portion CP1 preferably is about 0.315 mm and a thickness in the direction of layering of layered portion CP1 preferably is about 0.47 mm, for example. A height of uppermost surface CP1*u* in the direction of layering of layered portion CP1 preferably is about 0.315+(0.47/2)=about 0.55 mm, for example.

When embedment layer R has elastic modulus $E_R$ of 25 GPa, a thickness of electronic component containing substrate 1 preferably is about 2.1 mm, for example, which is the sum of thickness $T_B$ of substrate B and thickness $T_R$ of embedment layer R. Therefore, a height of central plane MP in the direction of thickness of electronic component containing substrate 1 with one main surface of substrate B being defined as the reference surface preferably is about (2.1/2)−0.8=about 0.25 mm, for example.

A height of lowermost surface CP1*l* and a height of uppermost surface CP1*u* in the direction of layering of layered portion CP1 with one main surface of substrate B being defined as the reference surface are preferably about 0.08 mm and about 0.55 mm as above, respectively, for example.

When embedment layer R has elastic modulus $E_R$ of 35 GPa, a thickness of electronic component containing substrate 1 preferably is about 1.95 mm, for example, which is the sum of thickness $T_B$ of substrate B and thickness $T_R$ of the embedment layer. Therefore, a height of central plane MP in the direction of thickness of electronic component containing substrate 1 with one main surface of substrate B being defined as the reference surface preferably is about (1.95/2)−0.8=about 0.175 mm, for example.

A height of lowermost surface CP1*l* and a height of uppermost surface CP1*u* in the direction of layering of layered portion CP1 with one main surface of substrate B being defined as the reference surface preferably are about 0.08 mm and about 0.55 mm as above, respectively, for example.

Results above are summarized as in Tables 1 and 2 below.

TABLE 1

|  | Capacitance Generation portion |
| --- | --- |
| Lowermost Surface | 0.08 |
| Central Plane | 0.315 |
| Uppermost Surface | 0.55 |

TABLE 2

|  |  | Central Plane of Electronic Component Containing Substrate |
| --- | --- | --- |
| Elastic Modulus of Resin Layer | 15 GPa | 0.4 |
|  | 25 GPa | 0.25 |
|  | 35 GPa | 0.175 |

It was found based on comparison between Tables 1 and 2 that when central plane MP of the electronic component containing substrate was at a position as high as or higher than lowermost surface CP1*l* in the direction of thickness of layered portion CP1 and as high as or lower than uppermost surface CP1*u*, that is, at a position where it passed through layered portion CP1, generation of audible sound due to vibration was decreased.

As described previously, in at least one of the surface and the inside of substrate B, preferably, a conductive pattern composed of a metal such as Cu is formed in a plurality of layers or a woven fabric of glass or the like is embedded in an insulating layer of substrate B. In this case, elastic modulus $E_R$ of the embedment layer tends to be equal to or lower than elastic modulus $E_B$ of the substrate.

It can be concluded that the portions above and under central plane MP of electronic component containing substrate 1 effectively mutually cancel vibrations when elastic modulus $E_R$ of embedment layer R is equal to or lower than elastic modulus $E_B$ of substrate B and central plane MP of electronic component containing substrate 1 is located at a position where it passes through a portion not lower than central plane CP1*m* of layered portion CP1. Therefore, as thickness $T_R$ of embedment layer R formed on one main surface of substrate B satisfies the condition above, vibration of substrate B is reliably decreased and generation of audible sound due to the vibration is reliably prevented or decreased.

In the preferred embodiment shown in FIGS. 1 and 2, first side portion P11 of ceramic multilayer body 11 is substantially the same in thickness as second side portion P12. First side portion P11 of ceramic multilayer body 11 may be greater in thickness than second side portion P12. Thus, a distance between layered portion CP1 and substrate B can be longer than in the preferred embodiment shown in FIGS. 1 and 2 described previously.

In this case, a relationship among thickness $T_B$ of substrate B, thickness $T_R$ of embedment layer R, and a height of first electronic component 10 is readily adjusted. Design is so facilitated that central plane MP of electronic component containing substrate 1 in the direction of thickness is located at a position where it passes through layered portion CP1. Therefore, lessening of vibration of substrate B in the audible frequency range is facilitated and prevention or lessening of generation of audible sound due to the vibration of substrate B is facilitated.

By adjusting relationship between a height of the top of connection member S for connection of first electronic component 10 to first mounting land L11 and second mounting land L12 from substrate B and a height of layered portion CP1, vibration of electronic component containing substrate 1 is further effectively decreased.

First Modification of First Preferred Embodiment

An electronic component containing substrate 1-1 representing a first modification of electronic component containing substrate 1 will be described with reference to FIGS. 6 and 7.

Figure 6:
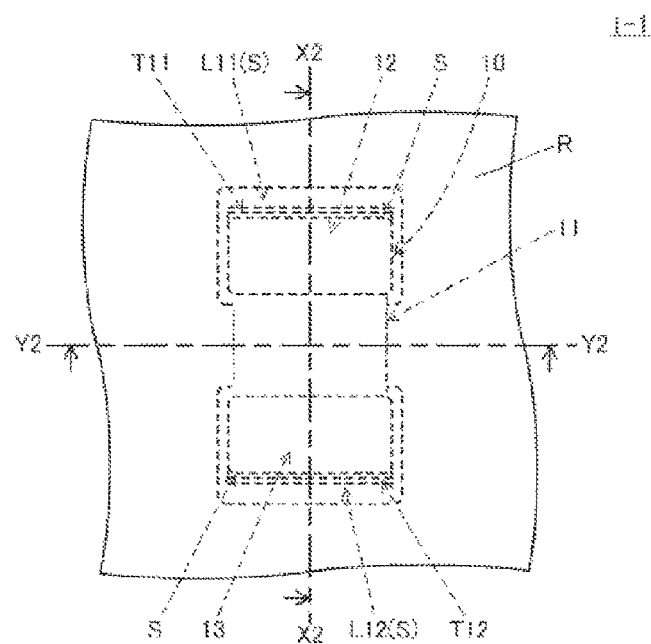
FIG. 6 is a top view corresponding to FIG. 1, of an electronic component containing substrate 1-1 representing a first modification of electronic component containing substrate 1 shown in FIG. 1.
Figure 7A:
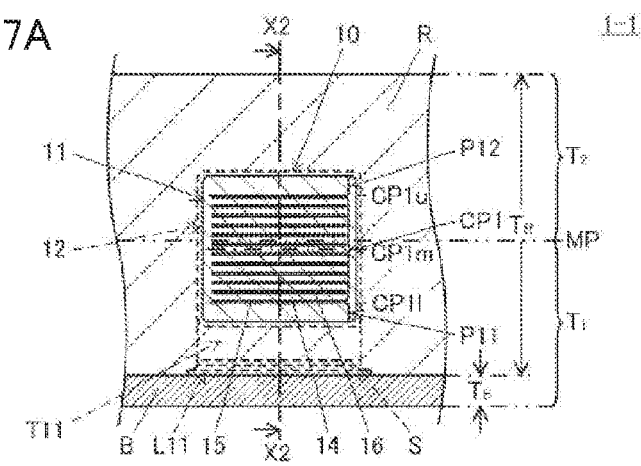
FIGS. 7A and 7B are cross-sectional views corresponding to FIG. 2, of electronic component containing substrate 1-1 shown in FIG. 6.
Figure 7B:
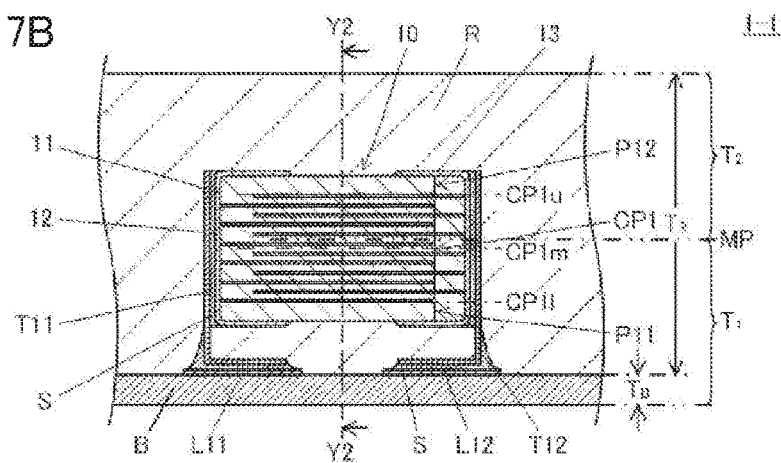

FIG. 6 is a top view of electronic component containing substrate 1-1. FIG. 7A is a cross-sectional view along a surface including the line Y2-Y2 in FIG. 6. FIG. 7B is a cross-sectional view along a surface including the line X2-X2 in FIG. 6.

In electronic component containing substrate 1-1, first electronic component 10 is implemented by a layered capacitor with electrode terminal. The layered capacitor with electrode terminal includes a first electrode terminal T11 having one side connected to first external electrode 12 through connection member S and a second electrode terminal T12 having one side connected to second external electrode 13.

First electronic component 10 is mounted on one main surface of substrate B in such a manner that the other side of first electrode terminal T11 is connected to first mounting land L11 and the other side of second electrode terminal T12 is connected to second mounting land L12. Substrate B is shown in a simplified manner as in the first preferred embodiment described previously.

In electronic component containing substrate 1-1, as in the example where first electronic component 10 has first side portion P11 greater in thickness than second side portion P12, a distance between layered portion CP1 and substrate B is able to be increased. Design is so facilitated that central plane MP of electronic component containing substrate 1-1 in the direction of thickness is located at a position where it passes through layered portion CP1 by adjusting a relationship among thickness $T_B$ of substrate B, thickness $T_R$ of embedment layer R, and a height of first electronic component 10. Therefore, lessening of vibration by mutual cancellation of vibrations by the portions above and under central plane MP in the direction of thickness of electronic component containing substrate 1-1 is facilitated and prevention or lessening of generation of audible sound due to the vibration of substrate B is facilitated.

Second Modification of First Preferred Embodiment

An electronic component containing substrate 1-2 representing a second modification of electronic component containing substrate 1 will be described with reference to FIGS. 8 and 9.

Figure 8:
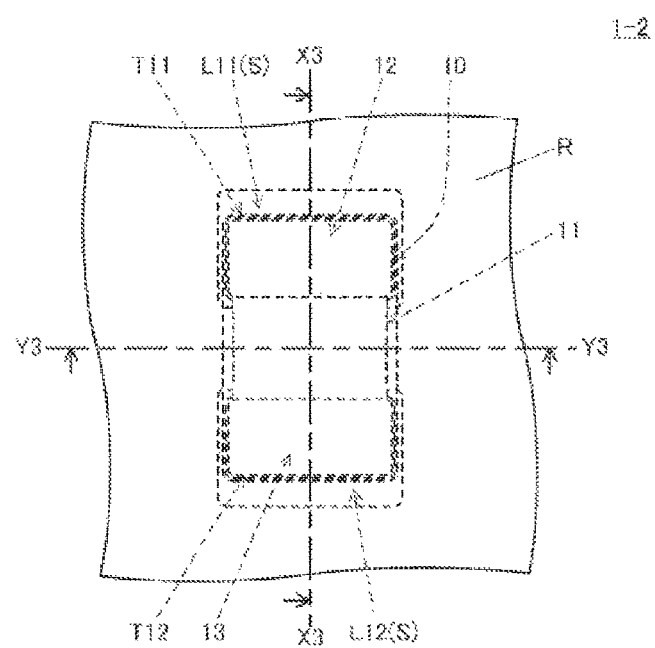
FIG. 8 is a top view corresponding to FIG. 1, of an electronic component containing substrate 1-2 representing a second modification of electronic component containing substrate 1 shown in FIG. 1.
Figure 9A:
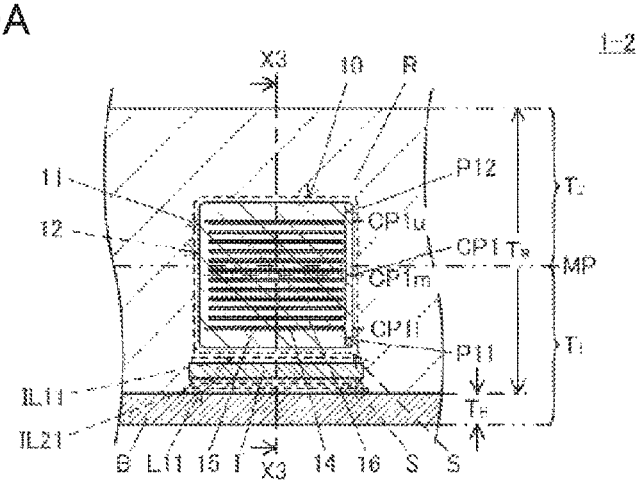
FIGS. 9A and 9B are cross-sectional views corresponding to FIG. 2, of electronic component containing substrate 1-2 shown in FIG. 8.
Figure 9B:
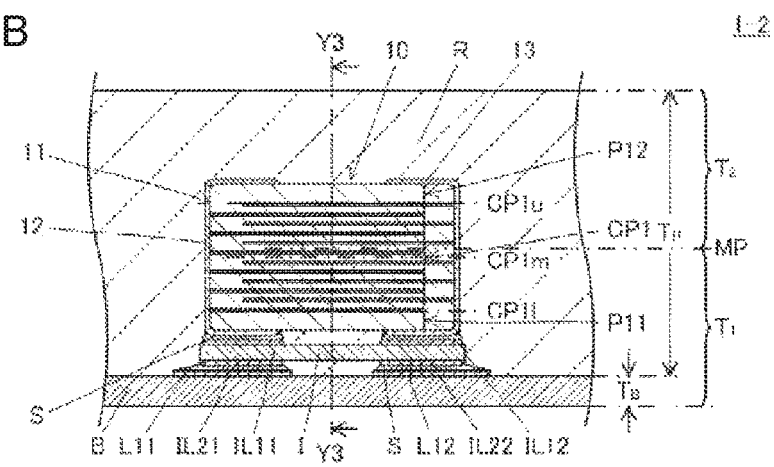

FIG. 8 is a top view of electronic component containing substrate 1-2. FIG. 9A is a cross-sectional view along a surface including the line Y3-Y3 in FIG. 8. FIG. 9B is a cross-sectional view along a surface including the line X3-X3 in FIG. 8.

In electronic component containing substrate 1-2, first electronic component 10 includes what is called an interposer I. Interposer I has one main surface and the other main surface substantially in parallel to each other, includes one main surface provided with a first relay land IL11 and a second relay land IL12, and has the other main surface provided with a third relay land IL21 and a fourth relay land IL22. First relay land IL11 and second relay land IL12 conduct to third relay land IL21 and fourth relay land IL22, respectively.

First relay land IL11 and second relay land IL12 of interposer I are connected to first external electrode 12 and second external electrode 13, respectively, with connection member S. Third relay land IL21 and fourth relay land IL22 provided on the other main surface of interposer I are connected to first mounting land L11 and second mounting land L12 on substrate B, respectively, with connection member S.

Consequently, first external electrode 12 is connected to first mounting land L11 with interposer I being interposed. Second external electrode 13 is connected to second mounting land L12 with interposer I being interposed. Substrate B is shown in a simplified manner as in the first preferred embodiment and the first modification thereof described previously.

In electronic component containing substrate 1-2, as in the example in which first side portion P11 of ceramic multilayer body 11 is greater in thickness than second side portion P12 and as in electronic component containing substrate 1-1, a distance between layered portion CP1 and substrate B can be increased. Design is so facilitated that central plane MP of electronic component containing substrate 1 in the direction of thickness is located at a position where it passes through layered portion CP1 by adjusting a relationship among thickness $T_B$ of substrate B, thickness $T_R$ of embedment layer R, and a height of first electronic component 10. Therefore, lessening of vibration by mutual cancellation of vibrations by the portions above and under central plane MP in the direction of thickness of electronic component containing substrate 1-2 is facilitated and prevention or lessening of generation of audible sound due to the vibration is facilitated.

One non-limiting example of a method for manufacturing electronic component containing substrate 1 representing the first preferred embodiment of the electronic component containing substrate according to a preferred embodiment of the present invention will be described with reference to FIGS. 10A, 10B, 11A and 11B. FIGS. 10A, 10B, 11A and 11B are diagrams schematically showing a mounting step and an embedment layer forming step successively performed in one example of the method for manufacturing electronic component containing substrate 1, respectively. FIGS. 10A, 10B, 11A and 11B correspond to a cross-sectional view along the surface including the line Y1-Y1 in FIG. 1 (FIG. 2A).

Figure 10A:
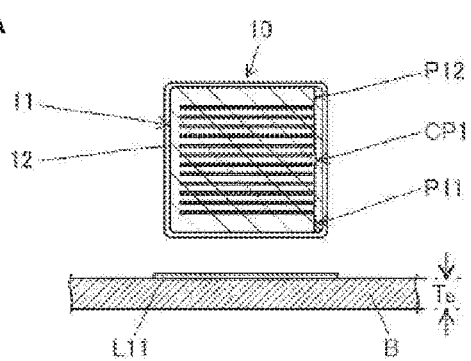
FIGS. 10A and 10B are diagrams schematically showing a mounting step for illustrating one example of a method for manufacturing electronic component containing substrate 1 shown in FIGS. 1 and 2.
Figure 10B:
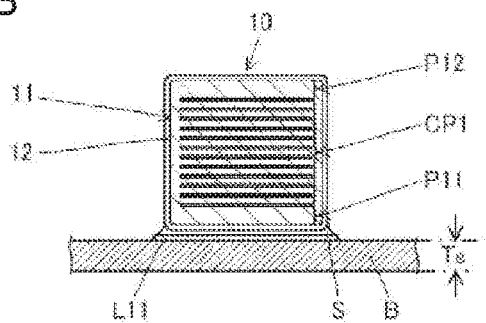

FIGS. 10A and 10B are diagrams schematically showing the mounting step in the method for manufacturing electronic component containing substrate 1. In the mounting step, first electronic component 10 is mounted on one main surface of substrate B.

FIG. 10A shows a stage of preparation of first electronic component 10 and substrate B on which first electronic component 10 is to be mounted. First electronic component 10 is a multilayer ceramic capacitor having the structure described previously, in which distortion is produced at the time of application of a voltage. Substrate B includes on one main surface, first mounting land L11 and second mounting land L12 for connection of first electronic component 10 (second mounting land L12 not shown).

FIG. 10B shows a stage of mounting first electronic component 10 on one main surface of substrate B by connecting first electronic component 10 to first mounting land L11 and second mounting land L12 with connection member S. First side portion P11 is located between layered portion CP1 and one main surface of substrate B in the direction of thickness which is a direction perpendicular to one main surface of substrate B.

Figure 11A:
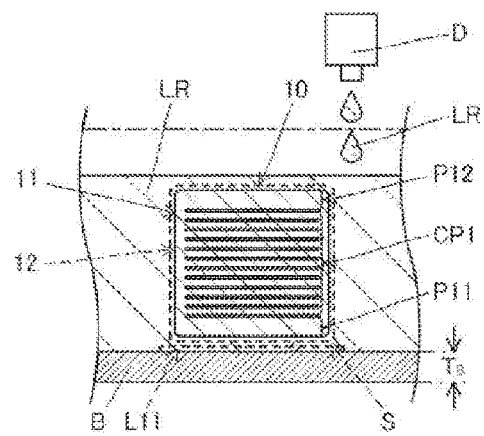
FIGS. 11A and 11B are diagrams schematically showing an embedment layer forming step for illustrating one example of the method for manufacturing electronic component containing substrate 1 shown in FIGS. 1 and 2.
Figure 11B:
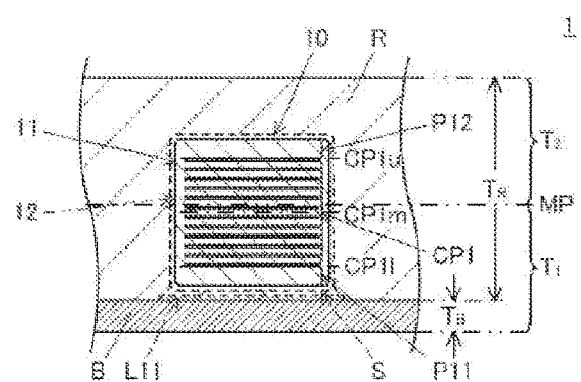

FIGS. 11A and 11B are diagrams schematically showing the embedment layer forming step in the method for manufacturing electronic component containing substrate 1. In the embedment layer forming step, embedment layer R embedding first electronic component 10 is provided on one main surface of substrate B.

FIG. 11A shows a stage of application of a liquid resin LR to one main surface of substrate B on which first electronic component 10 is mounted, for example, with a dispenser d, to a prescribed thickness shown with a chain dotted line.

An apparatus used for application is not limited to dispenser d and an existing application apparatus can be used. For example, various coaters such as a curtain coater and a spin coater may be used. Liquid resin LR is not limited to a resin composed of a single resin material, and a resin containing a glass material or silica as a filler in an insulating resin material can be used.

Embedment layer R may be formed by placing a prepreg in a form of a sheet in a semi-cured state on one main surface of substrate B and pressing the prepreg so as to embed first electronic component 10, without being limited to a method of application of liquid resin LR as in FIG. 11A.

FIG. 11B shows a stage of obtaining cured embedment layer R by heating and curing liquid resin LR in which first electronic component 10 has been embedded. As described previously, embedment layer R may be formed to include resin material portion RM and conductive material portion CM provided on the surface thereof (see FIG. 4).

A thickness of electronic component containing substrate 1 is expressed as the sum of thickness $T_B$ of substrate B and thickness $T_R$ of embedment layer R. Central plane MP in the direction of thickness of electronic component containing substrate 1 is defined as a surface assumed such that distance $T_1$ from one main surface of electronic component containing substrate 1 (the outer surface of substrate B) is equal to distance $T_2$ from the other main surface thereof (the outer surface of embedment layer R) as described previously.

Embedment layer R is provided such that central plane MP of electronic component containing substrate 1 is located at a position where it passes through layered portion CP1, in other words, at a position not lower than lowermost surface CP1l in the direction of thickness of layered portion CP1 and not higher than uppermost surface CP1u thereof.

The relationship above is considered to express such a condition that the portions above and under central plane MP in the direction of thickness of electronic component containing substrate 1 mutually cancel vibrations even though distortion is produced in first electronic component 10 as described previously.

In the embedment layer forming step, embedment layer R is preferably provided such that elastic modulus $E_R$ of embedment layer R is not higher than elastic modulus $E_B$ of substrate B and central plane MP of electronic component containing substrate 1 is located at a position where it passes through a portion not lower than central plane CPm of layered portion CP1 in the direction of thickness. In this case, the portions above and under central plane MP of electronic component containing substrate 1 effectively mutually cancel vibrations.

In adjustment of thickness $T_R$ of embedment layer R, liquid resin LR may be applied such that it has thickness $T_R$ after curing, allowing for change in volume during curing of liquid resin LR. Thickness $T_R$ of embedment layer R may be set to a desired value by applying liquid resin LR in advance in a relatively large amount and then removing an excessive resin after curing.

Second Preferred Embodiment

An electronic component containing substrate 1A according to a second preferred embodiment of the present invention will be described with reference to FIGS. 12 and 13.

Figure 12:
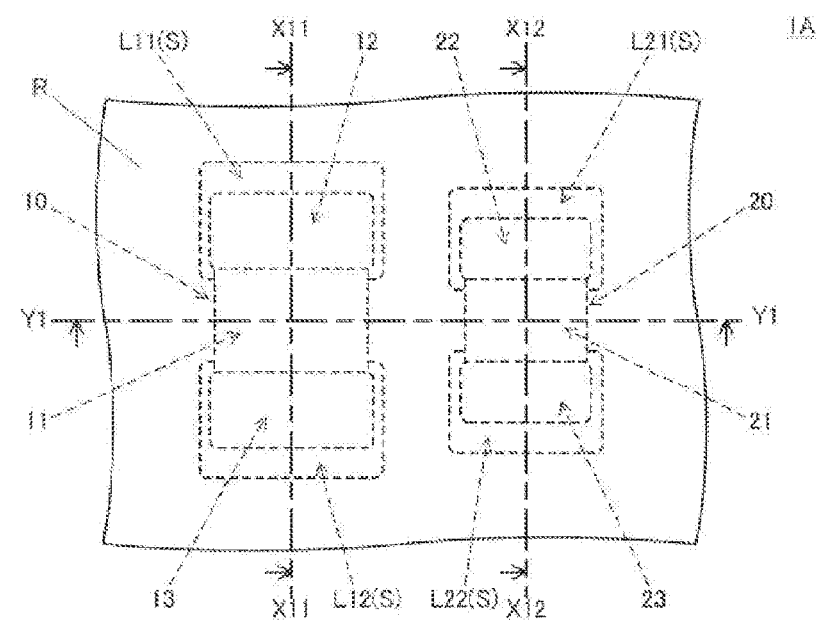
FIG. 12 is a top view of an electronic component containing substrate 1A according to a second preferred embodiment of the present invention.
Figure 13A:
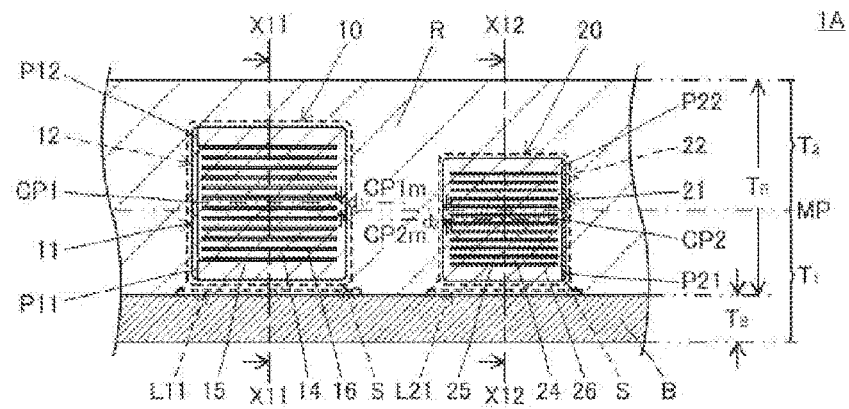
FIGS. 13A-13C are cross-sectional views of an electronic component containing substrate 1A shown in FIG. 12, with FIG. 13A showing a cross-sectional view along a surface including the line Y1-Y1 in FIG. 12 and FIG. 13B showing a cross-sectional view along a surface including the line X1-X1 in FIG. 12.
Figure 13B:
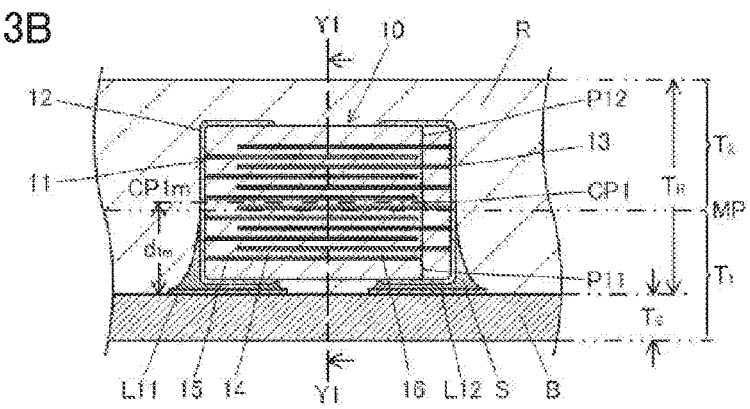
Figure 13C:
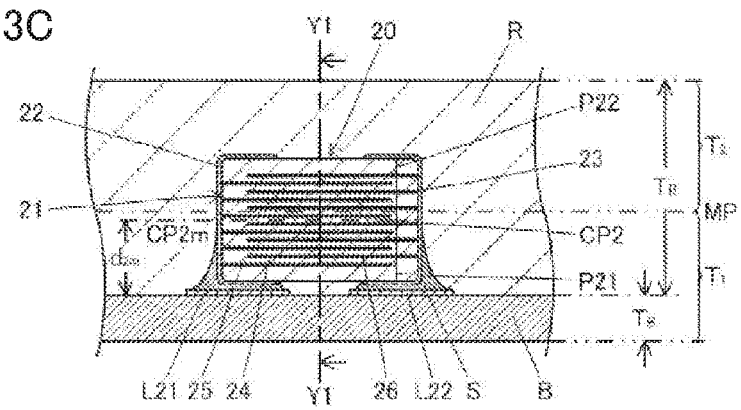

FIG. 12 is a top view of electronic component containing substrate 1A. A dotted line in FIG. 12 shows components including first electronic component 10 and a second electronic component 20 when embedment layer R is seen through as well as first mounting land L11, second mounting land L12, a third mounting land L21, and a fourth mounting land L22. FIG. 13A is a cross-sectional view along a surface including the line Y1-Y1 in FIG. 12. FIG. 13B is a cross-sectional view along a surface including the line X11-X11 in FIG. 12. FIG. 13C is a cross-sectional view along a surface including the line X12-X12 in FIG. 12.

Electronic component containing substrate 1A includes substrate B, first electronic component 10 and second electronic component 20, and embedment layer R.

Substrate B has one main surface and the other main surface substantially in parallel to each other. First electronic component 10 and second electronic component 20 are mounted on one main surface of substrate B. FIG. 12 shows an example in which the electronic components are mounted on substrate B such that a central plane in a longitudinal direction of ceramic multilayer body 11 of first electronic component 10 and a central plane in a longitudinal direction of a ceramic multilayer body 21 of second electronic component 20 are included in the same plane (a surface along the line Y1-Y1).

Substrate B is a multilayer substrate corresponding to FIG. 44 described previously, and it is shown in a simplified manner with an internal electrode or a via not being shown. Substrate B includes an insulating layer and an interconnection layer as in the multilayer substrate shown in FIG. 44. The insulating layer contains a woven fabric or a nonwoven fabric of glass, silica, or the like and an insulating resin. In a preferred embodiment of the present invention, in order to emphasize first electronic component 10 and second electronic component 20, a relationship in magnitude of substrate B with first electronic component 10 and second electronic component 20 is different from an actual state.

First electronic component 10 includes a multilayer ceramic capacitor including ceramic multilayer body 11 and first external electrode 12 and second external electrode 13. Ceramic multilayer body 11 includes layered portion CP1 and first side portion P11 and second side portion P12 between which layered portion CP1 lies. Layered portion CP1 corresponds to what is called a capacitance generation portion in which capacitor elements each having ceramic dielectric layer 14 interposed between first internal electrode 15 and second internal electrode 16 are layered. First side portion P11 and second side portion P12 correspond to what is called a first protection portion and a second protection portion, respectively, which protect layered portion CP1 against an external environment. Ceramic multilayer body 11 includes two opposing end surfaces and side surfaces connecting the two end surfaces to each other.

First external electrode 12 and second external electrode 13 of first electronic component 10 are provided on the surface of ceramic multilayer body 11. First external electrode 12 is connected to first internal electrode 15 on one end surface of ceramic multilayer body 11. Second external electrode 13 is connected to second internal electrode 16 on the other end surface of ceramic multilayer body 11.

Second electronic component 20 includes a multilayer ceramic capacitor including ceramic multilayer body 21 and a first external electrode 22 and a second external electrode 23, similarly to first electronic component 10. Ceramic multilayer body 21 includes a layered portion CP2 as well as a first side portion P21 and a second side portion P22 between which layered portion CP2 lies. Layered portion CP2 corresponds to what is called a capacitance generation portion in which capacitor elements each including a ceramic dielectric layer 24 interposed between a first internal electrode 25 and a second internal electrode 26 are layered. First side portion P21 and second side portion P22 correspond to what is called a first protection portion and a second protection portion, respectively, which protect layered portion CP2 against an external environment. Ceramic multilayer body 21 includes two opposing end surfaces and side surfaces connecting the two end surfaces to each other.

First external electrode 22 and second external electrode 23 of second electronic component 20 are provided on a surface of ceramic multilayer body 21. First external electrode 22 is connected to first internal electrode 25 on one end surface of ceramic multilayer body 21. Second external electrode 22 is connected to second internal electrode 26 on the other end surface of ceramic multilayer body 21.

As the ceramic dielectric layer in each of first electronic component 10 and second electronic component 20 has electrostriction or an inverse piezoelectric effect, distortion is produced in first electronic component 10 and second electronic component 20 at the time of application of a voltage. Examples of representative ceramic materials having electrostriction or an inverse piezoelectric effect include a ceramic material high in dielectric constant basically composed of barium titanate.

In FIGS. 13A and B, first electronic component 10 is connected on first mounting land L11 and second mounting land L12 with connection member S. Similarly, second electronic component 20 is connected on third mounting land L21 and fourth mounting land L22 with connection member S.

A material for first mounting land L11, second mounting land L12, third mounting land L21, and fourth mounting land L22 and a material for the connection member can be selected as appropriate from existing materials for use. For example, solder, a conductive adhesive, and a via conductor can be used for connection member S. First mounting land L11 and second mounting land L12 are on an interconnection including a not-shown conductive pattern. A voltage is applied to first electronic component 10 through this interconnection. Similarly, third mounting land L21 and fourth mounting land L22 are on an interconnection including a not-shown conductive pattern. A voltage is applied to second electronic component 20 through this interconnection.

A direction perpendicular to one main surface of substrate B is defined as the direction of thickness of electronic component containing substrate 1A. Based on such definition, the central plane of layered portion CP1 of first electronic component 10 in the direction of thickness is denoted as CP1$m$. A central plane of layered portion CP2 of second electronic component 20 in the direction of thickness is denoted as CP2$m$.

In electronic component containing substrate 1A, first electronic component 10 is mounted on substrate B such that a direction of layering of capacitor elements in ceramic multilayer body 11 is the same as the direction of thickness. In the direction of thickness, the lower side of layered portion CP1 of ceramic multilayer body 11, that is, the portion located between layered portion CP1 and one main surface of substrate B, is defined as first side portion P11, and the upper side of layered portion CP1 is defined as second side portion P12.

Second electronic component 20 is mounted on substrate B such that a direction of layering of capacitor elements in ceramic multilayer body 21 is the same as the direction of thickness. In the direction of thickness, a lower side of layered portion CP2 of ceramic multilayer body 21, that is, a portion located between layered portion CP2 and one main surface of substrate B, is defined as first side portion P21, and the upper side of layered portion CP2 is defined as second side portion P22.

Embedment layer R is formed of a resin material in which a glass material or silica is dispersed as a filler as will be described later. Embedment layer R is provided on one main surface of substrate B so as to embed first electronic component 10 and second electronic component 20.

Since a ceramic material high in dielectric constant basically composed of barium titanate is often used as described previously, first electronic component 10 and second electronic component 20 including a multilayer ceramic capacitor may vibrate due to distortion caused at the time of application of a voltage. Though vibration is transmitted to substrate B on which first electronic component 10 and second electronic component 20 are mounted through connection member S, vibration may be transmitted to substrate B also through embedment layer R when first electronic component 10 and second electronic component 20 are embedded in embedment layer R.

A thickness of electronic component containing substrate 1A is expressed as the sum of thickness $T_B$ of substrate B and thickness $T_R$ of embedment layer R. Central plane MP of electronic component containing substrate 1A in the direction of thickness is defined as the surface assumed such that distance $T_1$ from one main surface of electronic component containing substrate 1A (the other main surface of substrate B) is equal to distance $T_2$ from the other main surface thereof (the outer surface of embedment layer R).

In electronic component containing substrate 1A, the side surface of first electronic component 10 and the side surface of second electronic component 20 are opposed to each other with embedment layer R being interposed. First electronic component 10 is implemented by a multilayer ceramic capacitor greater in size than second electronic component 20. Therefore, in the direction of thickness, an interval $d_{1m}$ between central plane CP1$m$ of layered portion CP1 of first electronic component 10 and one main surface of substrate B is greater than an interval $d_{2m}$ between central plane CP2$m$ of layered portion CP2 of second electronic component 20 and one main surface of the substrate.

In the direction of thickness, central plane MP of electronic component containing substrate 1A is located between central plane CP1$m$ of layered portion CP1 of first electronic component 10 and central plane CP2$m$ of layered portion CP2 of second electronic component 20. In other words, central plane MP of electronic component containing substrate 1A is located on a side of substrate B relative to central plane CP1m of layered portion CP1 of first electronic component 10 and located on a side of the outer surface of embedment layer R relative to central plane CP2m of layered portion CP2 of second electronic component 20.

In FIG. 13A, central plane MP of electronic component containing substrate 1A is located at a position where distance $d_1$ from central plane CP1m of layered portion CP1 of first electronic component 10 is equal or substantially equal to distance $d_2$ from central plane CP2m of layered portion CP2 of second electronic component 20. As will be described later, distance $d_1$ and distance $d_2$ may be adjusted by adjusting a thickness of embedment layer R.

Electronic component containing substrate 1A vibrates because end surfaces of first electronic component 10 and second electronic component 20 distorted by application of a voltage produce a moment to bend electronic component containing substrate 1A. With the positional relationship above being set, when a voltage is applied to first electronic component 10, distortion produced in first electronic component 10 produces a bending moment as deforming the other main surface of substrate B to a recessed surface in a portion on the side of substrate B relative to central plane MP (a portion on the lower side). When a voltage is applied to second electronic component 20, distortion produced in second electronic component 20 produces a bending moment as deforming the outer surface of embedment layer R to a recessed surface in a portion on the side of the outer surface of embedment layer R relative to central plane MP (a portion on the upper side).

With central plane MP in the direction of thickness of electronic component containing substrate 1A being located at the position above, even though distortion is produced in first electronic component 10 and second electronic component 20, the portions above and under the central plane mutually cancel bending moments, and consequently mutually cancel vibrations due to deformation based on the bending moments. Therefore, as the positional relationship between the central plane of the layered portion of each of first electronic component 10 and second electronic component 20 and central plane MP of electronic component containing substrate 1A satisfies the condition above, vibration of electronic component containing substrate 1A is decreased and generation of audible sound due to the vibration is prevented or decreased.

Figure 14:
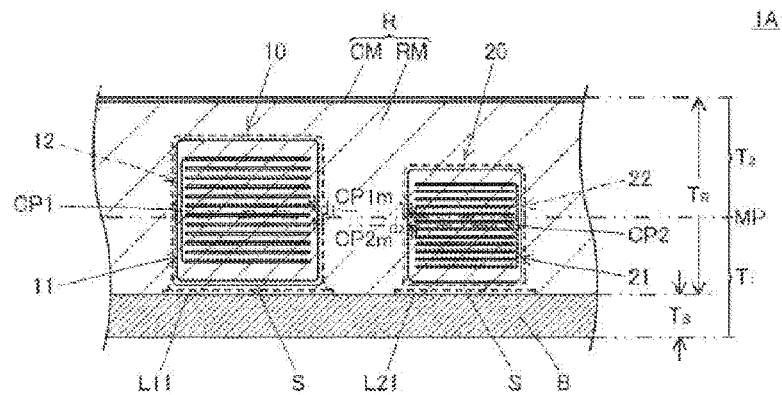
FIG. 14 is a cross-sectional view corresponding to FIG. 13A for illustrating an example in which embedment layer R includes resin material portion RM and conductive material portion CM provided on a surface thereof in electronic component containing substrate 1A shown in FIG. 12.

As shown in FIG. 14, embedment layer R may include resin material portion RM and conductive material portion CM provided on the surface thereof. FIG. 14 corresponds to a cross-sectional view along the surface including the line Y1-Y1 in FIG. 12 (FIG. 13A).

As will be described later, resin material portion RM can be formed, for example, by using an insulating resin material in which a glass material or silica is dispersed as a filler. Conductive material portion CM can be formed, for example, with what is called a thin film formation method such as application of a conductive resin material or sputtering of a metal material. In this case, an outer surface of conductive material portion CM is defined as the other main surface of electronic component containing substrate 1A. Therefore, a position of central plane MP of electronic component containing substrate 1A in the direction of thickness is also determined accordingly.

Figure 15:
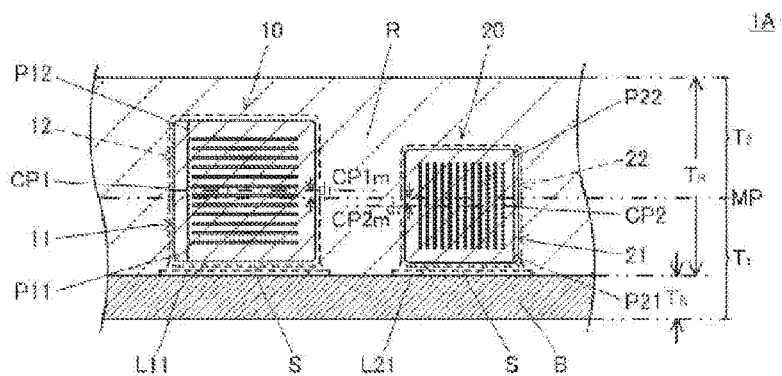
FIG. 15 is a cross-sectional view corresponding to FIG. 13A for illustrating an example in which a direction of mounting of at least one of first electronic component 10 and a second electronic component 20 is varied in electronic component containing substrate 1A shown in FIG. 12.

As shown in FIG. 15, in electronic component containing substrate 1A, at least one of first electronic component 10 and second electronic component 20 may be mounted on substrate B such that a direction of layering of capacitor elements is perpendicular to the direction of thickness. FIG. 15 shows an example in which the direction of layering of capacitor elements of second electronic component 20 is perpendicular to the direction of thickness.

Figure 16:
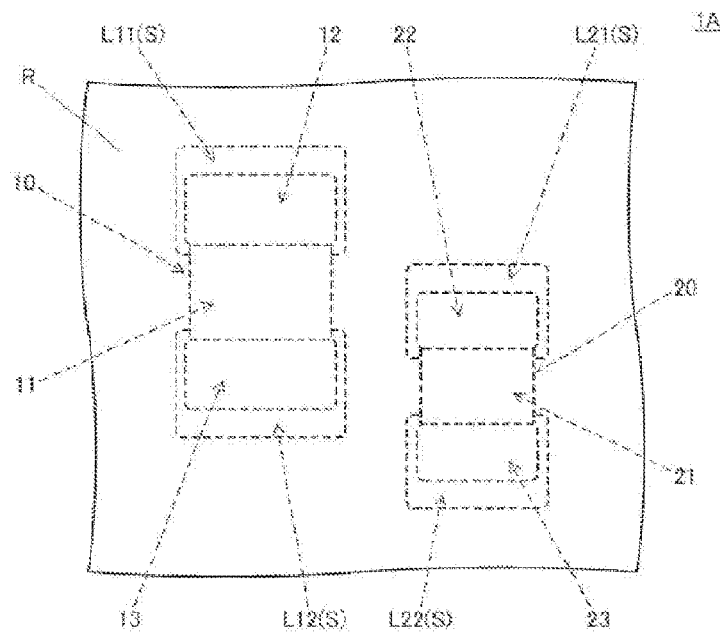
FIG. 16 is a top view corresponding to FIG. 12 for illustrating an example in which relative positions of first electronic component 10 and second electronic component 20 are varied in electronic component containing substrate 1A shown in FIG. 12.

As shown in FIG. 16, in electronic component containing substrate 1A, first electronic component 10 and second electronic component 20 may be mounted on substrate B such that the central plane in the longitudinal direction of ceramic multilayer body 11 of first electronic component 10 and the central plane in the longitudinal direction of ceramic multilayer body 21 of second electronic component 20 are not included in the same plane.

A plurality of first electronic components 10 and a plurality of second electronic components 20 may be mounted on electronic component containing substrate 1A so long as suppression of vibration of electronic component containing substrate 1A based on adjustment of a thickness of substrate B, a thickness of embedment layer R, and a height of first electronic component 10 and second electronic component 20 is not affected. Similarly, an electronic component other than a multilayer ceramic capacitor may be mounted on electronic component containing substrate 1A.

Though a multilayer ceramic capacitor is exemplified as a specific example of first electronic component 10 and second electronic component 20 in the second preferred embodiment, limitation thereto is not intended. Preferred embodiments of the present invention are also applicable to an example in which a layered metallized film capacitor representing a layered capacitor having a dielectric layer composed of a resin material is used as at least one of first electronic component 10 and second electronic component 20.

Though first side portion P11 of ceramic multilayer body 11 of first electronic component 10 is the same or substantially the same in thickness as second side portion P12 in electronic component containing substrate 1A, first side portion P11 may be greater in thickness than second side portion P12. In this case, in the direction of thickness, adjustment of interval $d_1$ between central plane CP1m of layered portion CP1 of first electronic component 10 and central plane MP of electronic component containing substrate 1A and interval $d_2$ between central plane CP2m of layered portion CP2 of second electronic component 20 and central plane MP of electronic component containing substrate 1A is facilitated.

When embedment layer R is provided such that interval $d_1$ is smaller than interval $d_2$, as described previously, balance between the bending moment as deforming the portion under central plane MP of electronic component containing substrate 1A and the bending moment as deforming the portion above central plane MP of electronic component containing substrate 1A can effectively be kept. The portions under and above central plane MP of electronic component containing substrate 1A effectively mutually cancel vibrations due to deformation based on the bending moments. Therefore, as the positional relationship between the central plane of the layered portion of each of first electronic component 10 and second electronic component 20 and central plane MP of electronic component containing substrate 1A satisfies the condition above, vibration of electronic component containing substrate 1A is decreased and generation of audible sound due to the vibration is prevented or decreased.

One non-limiting example of a method for manufacturing electronic component containing substrate 1A according to the second preferred embodiment of the electronic component containing substrate according to a preferred embodiment of the present invention will be described with reference to FIGS. 17A, 17B, and 18A-18C. FIGS. 17A, 17B, and 18A-18C are diagrams schematically showing the mounting step and the embedment layer forming step successively performed in one non-limiting example of the method for manufacturing electronic component containing substrate 1A, respectively. FIGS. 17A, 17B, and 18A-18C correspond to a cross-sectional view along the surface including the line Y1-Y1 in FIGS. 13A-13C (FIG. 14A).

Figure 17A:
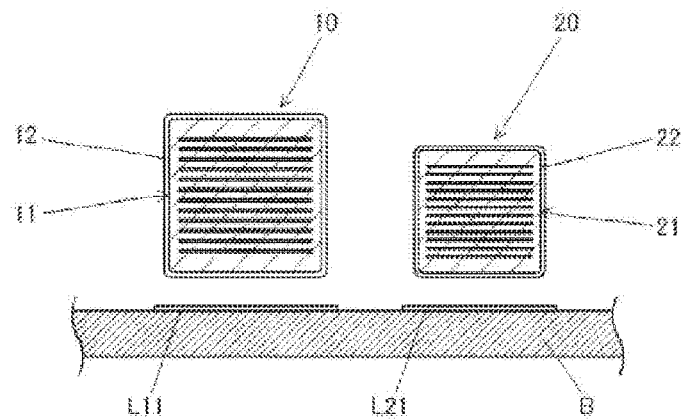
FIGS. 17A and 17B are diagrams schematically showing a mounting step for illustrating one example of a method for manufacturing electronic component containing substrate 1A shown in FIGS. 12 and 13.
Figure 17B:
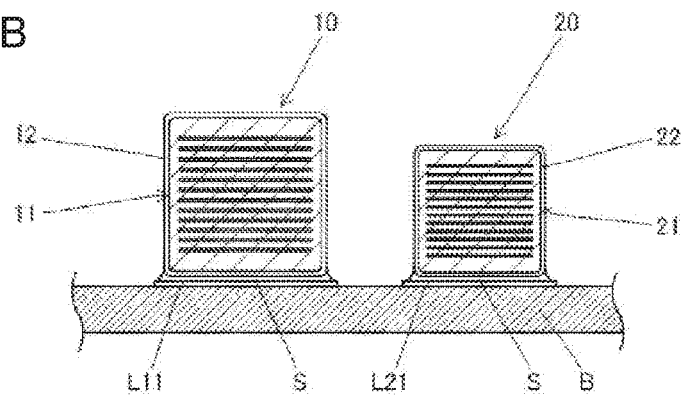

FIGS. 17A and 17B are diagrams schematically showing the mounting step in the method for manufacturing electronic component containing substrate 1A. In the mounting step, first electronic component 10 and second electronic component 20 are mounted on one main surface of substrate B.

FIG. 17A shows a stage of preparation of first electronic component 10 and second electronic component 20 and substrate B on which first electronic component 10 and second electronic component 20 are to be mounted. First electronic component 10 and second electronic component 20 each include a multilayer ceramic capacitor having the structure described previously in which distortion is produced at the time of application of a voltage. Substrate B includes on one main surface, first mounting land L11 and second mounting land L12 for connection of first electronic component 10 (second mounting land L12 not shown) and third mounting land L21 and fourth mounting land L22 for connection of second electronic component 20 (fourth mounting land L22 not shown).

FIG. 17B shows a stage of mounting of first electronic component 10 and second electronic component 20 on one main surface of substrate B by connecting first electronic component 10 and second electronic component 20 to the mounting lands with connection member S. In the mounting step, first electronic component 10 and second electronic component 20 are mounted at a distance from each other such that a side surface of first electronic component 10 and a side surface of second electronic component 20 are opposed to each other. In the direction of thickness, interval $d_{1m}$ between central plane CP1$m$ of layered portion CP1 of first electronic component 10 and one main surface of substrate B is greater than interval $d_{2m}$ between central plane CP2$m$ of layered portion CP2 of second electronic component 20 and one main surface of substrate B. Since first electronic component 10 is a multilayer ceramic capacitor greater in size than second electronic component 20 in FIGS. 17A and 17B, a relationship of an interval between the central plane of the layered portion of each electronic component and one main surface of substrate B is satisfied.

First electronic component 10 and second electronic component 20 are mounted on substrate B such that the direction of layering of capacitor elements of the ceramic multilayer body included therein is the same as the direction of thickness. As described previously, at least one of first electronic component 10 and second electronic component 20 may be mounted on substrate B such that the direction of layering of the capacitor elements is perpendicular to the direction of thickness (see FIG. 15).

Figure 18A:
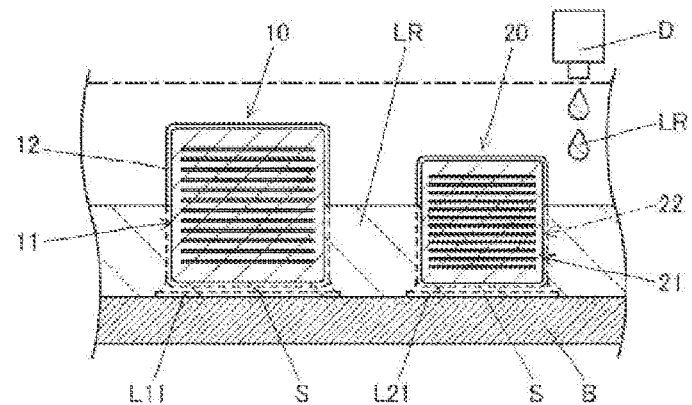
FIGS. 18A-18C are diagrams schematically showing an embedment layer forming step for illustrating one example of the method for manufacturing electronic component containing substrate 1A shown in FIGS. 12 and 13.
Figure 18B:
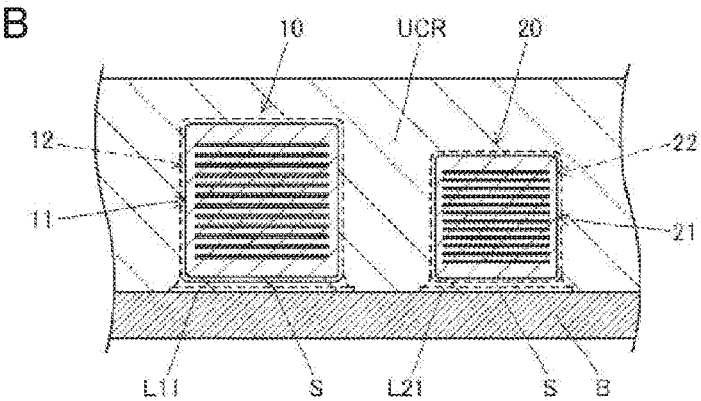
Figure 18C:
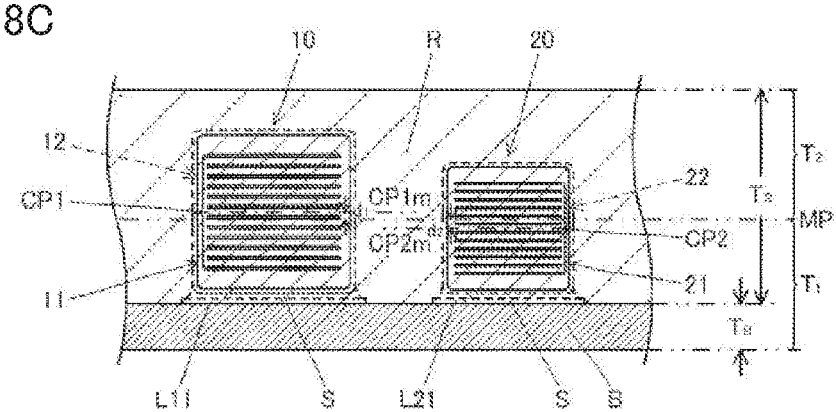

FIGS. 18A-18C are diagrams schematically showing the embedment layer forming step in the method for manufacturing electronic component containing substrate 1A. In the embedment layer forming step, embedment layer R embedding first electronic component 10 and second electronic component 20 is provided on one main surface of substrate B.

FIG. 18A shows a stage of application of liquid resin LR to one main surface of substrate B on which first electronic component 10 and second electronic component 20 are mounted, for example, with dispenser d, to a prescribed thickness shown with a chain dotted line. FIG. 18B shows a stage of formation of an uncured embedment layer UCR by application of liquid resin LR to the prescribed thickness. An apparatus used for application is not limited to dispenser d and an existing application apparatus can be used. For example, various coaters such as a curtain coater and a spin coater may be used.

Liquid resin LR is not limited to a resin composed of a single resin material, and a resin containing a glass material or silica as a filler in an insulating resin material can be used. Uncured embedment layer UCR may be provided by placing a prepreg in a form of a sheet in a semi-cured state on one main surface of substrate B and pressing the prepreg so as to embed first electronic component 10 and second electronic component 20, without being limited to a method of application of liquid resin LR as in FIG. 18A.

FIG. 18C shows a stage of completion of electronic component containing substrate 1A by heating and curing uncured embedment layer UCR to obtain embedment layer R. As described previously, embedment layer R may be formed to include resin material portion RM and conductive material portion CM provided on the surface thereof (see FIG. 14). Through this stage, embedment layer R embedding first electronic component 10 and second electronic component 20 is provided on one main surface of substrate B.

A thickness of electronic component containing substrate 1A is expressed as the sum of thickness $T_B$ of substrate B and thickness $T_R$ of embedment layer R as described previously. Central plane MP of electronic component containing substrate 1A in the direction of thickness is defined as a surface assumed such that distance $T_1$ from one main surface of electronic component containing substrate 1A (the other main surface of substrate B) is equal to distance $T_2$ from the other main surface thereof (the outer surface of embedment layer R). Embedment layer R is provided such that central plane MP of electronic component containing substrate 1A is located between central plane CP1$m$ of layered portion CP1 of first electronic component 10 and central plane CP2$m$ of layered portion CP2 of second electronic component 20 in the direction of thickness.

The relationship above is considered to express such a condition that the portions under and above the central plane mutually cancel bending moments and consequently mutually cancel vibrations due to deformation based on the bending moments even though distortion is produced in first electronic component 10 and second electronic component 20.

In adjustment of thickness $T_R$ of embedment layer R, liquid resin LR may be applied such that uncured embedment layer UCR has thickness $T_R$ after curing, allowing for change in volume during curing of uncured embedment layer UCR. Thickness $T_R$ of embedment layer R may be set to a desired value by forming uncured embedment layer UCR in advance to a relatively large thickness and then removing an excessive resin after curing.

First Modification of Second Preferred Embodiment

An electronic component containing substrate 1A-1 representing a first modification of electronic component containing substrate 1A will be described with reference to FIG. 19. Though electronic component containing substrate 1A-1 is different from electronic component containing substrate 1A described previously in including a third electronic component 30 in addition to first electronic component 10 and second electronic component 20, it is otherwise common thereto and hence description of a common portion will not be provided. Substrate B is shown in a simplified manner as in each preferred embodiment described previously.

Figure 19:
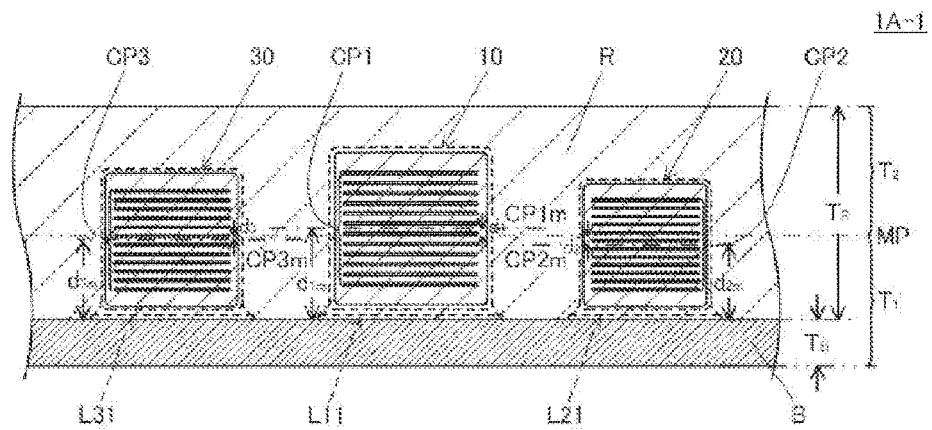
FIG. 19 is a cross-sectional view corresponding to FIG. 13A, of an electronic component containing substrate 1A-1 representing a first modification of electronic component containing substrate 1A shown in FIG. 12.

FIG. 19 is a cross-sectional view corresponding to FIG. 13A, of electronic component containing substrate 1A-1. Electronic component containing substrate 1A-1 further includes third electronic component 30 mounted on one main surface of substrate B. Third electronic component 30 is a multilayer ceramic capacitor similar in structure to first electronic component 10 and second electronic component 20.

Third electronic component 30 is connected on a fifth mounting land L31 and a sixth mounting land L32 (sixth mounting land L32 not shown) with connection member S. Fifth mounting land L31 and sixth mounting land L32 are on an interconnection including a not-shown conductive pattern. A voltage is applied to third electronic component 30 through this interconnection. Embedment layer R is provided on one main surface of substrate B as embedding first electronic component 10, second electronic component 20, and third electronic component 30.

In the direction of thickness of electronic component containing substrate 1A-1, a central plane CP3$m$ of a layered portion CP3 of third electronic component 30 is located on a side of substrate B relative to central plane MP of electronic component containing substrate 1A. An interval $d_3$ between central plane MP of electronic component containing substrate 1A-1 and central plane CP3$m$ of layered portion CP3 of third electronic component 30 is not greater than interval $d_2$ between central plane MP of electronic component containing substrate 1A and central plane CP2$m$ of layered portion CP2 of second electronic component 20.

Therefore, in the direction of thickness, an interval $d_{3m}$ between central plane CP3$m$ of layered portion CP3 of third electronic component 30 and one main surface of substrate B is greater than interval $d_{2m}$ between central plane CP2$m$ of layered portion CP2 of second electronic component 20 and one main surface of substrate B. One side surface of first electronic component 10 and a side surface of second electronic component 20 are opposed to each other with embedment layer R being interposed, and the other side surface of first electronic component 10 and a side surface of third electronic component 30 are opposed to each other with embedment layer R being interposed.

As described previously, a bending moment caused by distortion produced in first electronic component 10 is greater than a bending moment caused by distortion produced in second electronic component 20. In such a case, electronic component containing substrate 1A-1 further includes third electronic component 30 and first electronic component 10, second electronic component 20, and third electronic component 30 satisfy the positional relationship above. Central plane MP in the direction of thickness of electronic component containing substrate 1A is located between central plane CP1$m$ of layered portion CP1 of first electronic component 10 and central plane CP2$m$ of layered portion CP2 of second electronic component 20.

Then, balance between a bending moment as deforming the portion under central plane MP of electronic component containing substrate 1A-1 and a bending moment as deforming the portion above central plane MP of electronic component containing substrate 1A-1 is effectively maintained. Therefore, the portions under and above central plane MP of electronic component containing substrate 1A-1 effectively mutually cancel vibrations due to deformation based on the bending moments. Therefore, as a positional relationship among first electronic component 10, second electronic component 20, and third electronic component 30 satisfies the condition above, vibration of electronic component containing substrate 1A-1 is further decreased and generation of audible sound due to the vibration of substrate B is effectively prevented or decreased.

In the first modification, a multilayer ceramic capacitor is exemplified as a specific example of third electronic component 30. Without being limited as such, preferred embodiments of the present invention are also applicable to an example in which a layered metallized film capacitor representing a layered capacitor having a dielectric layer composed of a resin material is used as at least one of first electronic component 10 to third electronic component 30.

A non-limiting method for manufacturing electronic component containing substrate 1A-1 is basically in conformity with the mounting step and the embedment layer forming step in the method for manufacturing electronic component containing substrate 1 described previously.

In the mounting step, first electronic component 10, second electronic component 20, and third electronic component 30 are mounted on one main surface of substrate B such that one side surface of first electronic component 10 and a side surface of second electronic component 20 are opposed to each other at a distance from each other and the other side surface of first electronic component 10 and a side surface of third electronic component 30 are opposed to each other at a distance from each other.

In the embedment layer forming step, embedment layer R embedding first electronic component 10, second electronic component 20, and third electronic component 30 is provided on one main surface of substrate B such that central plane MP of electronic component containing substrate 1A-1 is located between central plane CP1$m$ of layered portion CP1 of first electronic component 10 and central plane CP2$m$ of layered portion CP2 of second electronic component 20 in the direction of thickness.

In this case, central plane CP3$m$ of layered portion CP3 of third electronic component 30 is located on the side of substrate B relative to central plane MP of electronic component containing substrate 1A-1, and interval $d_3$ between central plane MP of electronic component containing substrate 1A-1 and central plane CP3$m$ of layered portion CP3 of third electronic component 30 is not greater than interval $d_2$ between central plane MP of electronic component containing substrate 1A-1 and central plane CP2$m$ of layered portion CP2 of second electronic component 20. According to the manufacturing method above, electronic component containing substrate 1A-1 achieving further lessening of vibration and effectively achieving prevention or lessening of generation of audible sound due to the vibration is able to efficiently be manufactured.

Second Modification of Second Preferred Embodiment

An electronic component containing substrate 1A-2 representing a second modification of electronic component containing substrate 1A will be described with reference to FIG. 20. Though electronic component containing substrate 1A-2 is different from electronic component containing substrate 1A described previously in the form of first electronic component 10, it is otherwise common thereto and description of a common portion will not be provided. Substrate B is shown in a simplified manner as in each preferred embodiment described previously.

Figure 20A:
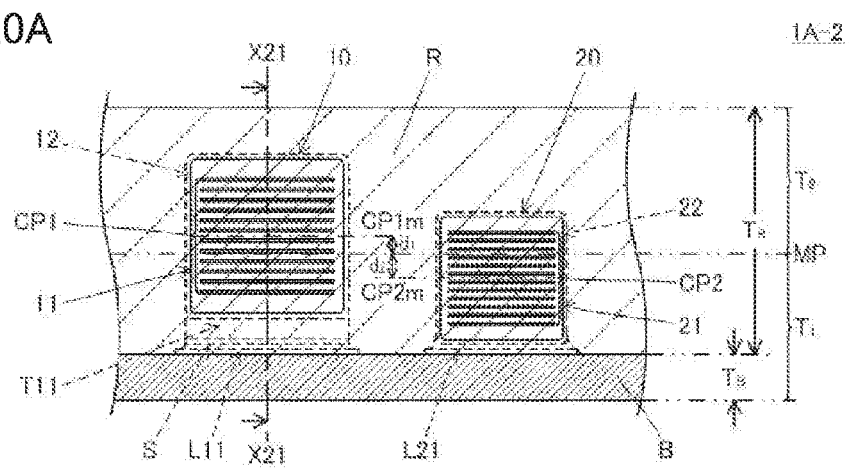
FIGS. 20A and 20B are cross-sectional views of an electronic component containing substrate 1A-2 representing a second modification of electronic component containing substrate 1A shown in FIG. 12, with FIG. 20A showing a cross-sectional view corresponding to FIG. 13A and FIG. 20B showing a cross-sectional view along a surface including the line X21-X21 in FIG. 20 A.
Figure 20B:
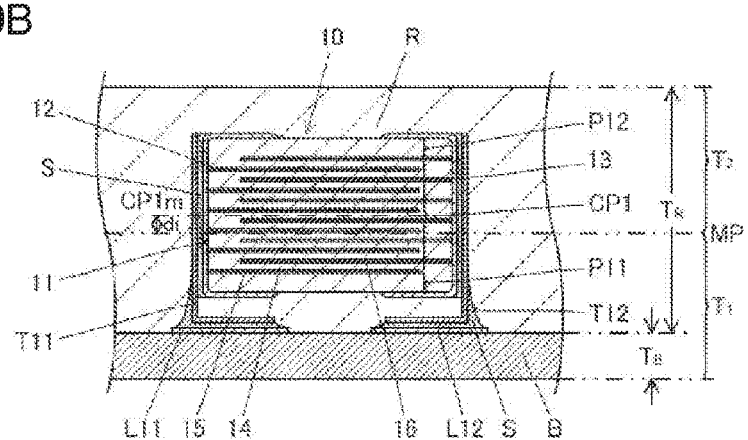

FIGS. 20A and 20B are cross-sectional views corresponding to FIG. 13A, of electronic component containing substrate 1A-2. FIG. 20B is a cross-sectional view along a surface including the line X21-X21 in FIG. 20A.

In electronic component containing substrate 1A-2, first electronic component 10 is implemented by a layered capacitor with electrode terminal. The layered capacitor with electrode terminal includes first electrode terminal T11 having one side connected to first external electrode 12 through connection member S and second electrode terminal T12 having one side connected to second external electrode 13.

First electronic component 10 is mounted on one main surface of substrate B in such a manner that the other side of first electrode terminal T11 is connected to first mounting land L11 and the other side of second electrode terminal T12 is connected to second mounting land L12. Substrate B is shown in a simplified manner as in each preferred embodiment described previously.

In electronic component containing substrate 1A-2, adjustment of interval $d_1$ between central plane CP1$m$ of layered portion CP1 of first electronic component 10 and central plane MP of electronic component containing substrate 1A-2 and interval $d_2$ between central plane CP2$m$ of layered portion CP2 of second electronic component 20 and central plane MP of electronic component containing substrate 1A-2 in the direction of thickness is facilitated.

Embedment layer R is provided such that interval $d_1$ is smaller than interval $d_2$ and central plane MP in the direction of thickness of electronic component containing substrate 1A-2 is located between central plane CP1$m$ of layered portion CP1 of first electronic component 10 and central plane CP2$m$ of layered portion CP2 of second electronic component 20.

Then, balance between a bending moment as deforming the portion under central plane MP of electronic component containing substrate 1A-2 and a bending moment as deforming the portion above central plane MP of electronic component containing substrate 1B is effectively maintained. Therefore, the portions under and above central plane MP of electronic component containing substrate 1A-2 effectively mutually cancel vibrations due to deformation based on the bending moments. Therefore, lessening of vibration by mutual cancellation of vibrations by the portions under and above central plane MP in the direction of thickness of electronic component containing substrate 1A-2 is facilitated and prevention or lessening of generation of audible sound due to the vibration is facilitated.

Third Modification of Second Preferred Embodiment

An electronic component containing substrate 1A-3 representing a third modification of electronic component containing substrate 1A will be described with reference to FIG. 21. Though electronic component containing substrate 1A-2 is different from electronic component containing substrate 1A described previously in the form of first electronic component 10, it is otherwise common thereto and description of a common portion will not be provided. Substrate B is shown in a simplified manner as in each preferred embodiment described previously.

Figure 21A:
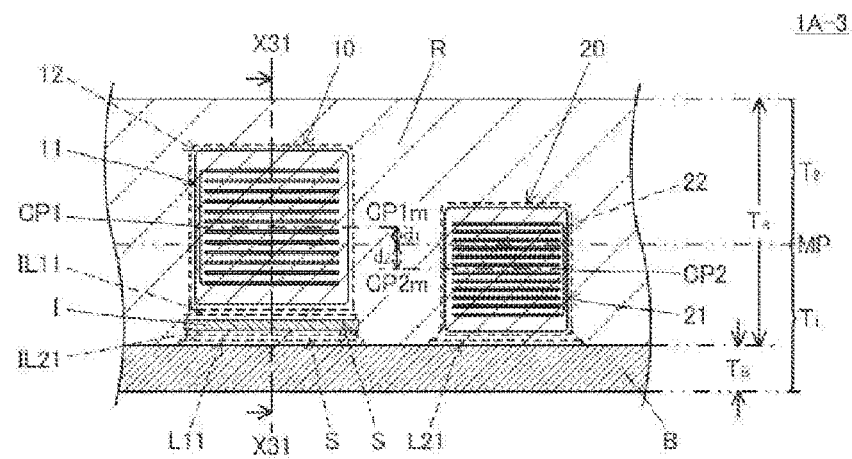
FIGS. 21A and 21B are cross-sectional views of an electronic component containing substrate 1A-3 representing a third modification of electronic component containing substrate 1A shown in FIG. 12, with FIG. 21A showing a cross-sectional view corresponding to FIG. 13A and FIG. 21B showing a cross-sectional view along a surface including the line X31-X31 in FIG. 21A.
Figure 21B:
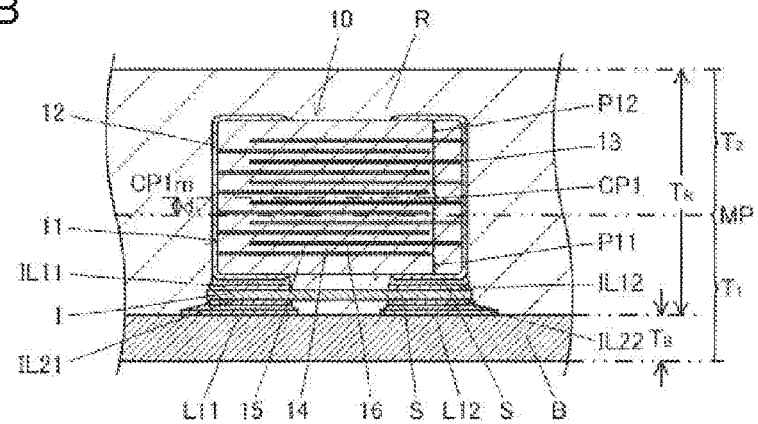

FIG. 21A is a cross-sectional view corresponding to FIG. 13A, of electronic component containing substrate 1A-3. FIG. 21B is a cross-sectional view along a surface including the line X31-X31 in FIG. 21A.

In electronic component containing substrate 1A-3, first electronic component 10 includes an interposer I. Interposer I has one main surface and the other main surface substantially in parallel to each other, has one main surface provided with first relay land IL11 and second relay land IL12, and has the other main surface provided with third relay land IL21 and fourth relay land IL22. First relay land IL11 and second relay land IL12 conduct to third relay land IL21 and fourth relay land IL22, respectively.

First relay land IL11 and second relay land IL12 of interposer I are connected to first external electrode 12 and second external electrode 13, respectively, with connection member S. Third relay land IL21 and fourth relay land IL22 provided on the other main surface of interposer I are connected to first mounting land L11 and second mounting land L12 on substrate B, respectively, with connection member S.

Consequently, first external electrode 12 is connected to first mounting land L11 with interposer I being interposed. Second external electrode 13 is connected to second mounting land L12 with interposer I being interposed.

In electronic component containing substrate 1A-3, in the direction of thickness, adjustment of interval $d_1$ between central plane CP1$m$ of layered portion CP1 of first electronic component 10 and central plane MP of electronic component containing substrate 1A-3 and interval $d_2$ between central plane CP2$m$ of layered portion CP2 of second electronic component 20 and central plane MP of electronic component containing substrate 1A-3 is facilitated.

Embedment layer R is provided such that interval $d_1$ is smaller than interval $d_2$ and central plane MP in the direction of thickness of electronic component containing substrate 1A-3 is located between central plane CP1$m$ of layered portion CP1 of first electronic component 10 and central plane CP2$m$ of layered portion CP2 of second electronic component 20.

Then, balance between a bending moment as deforming the portion under central plane MP of electronic component containing substrate 1A-3 and a bending moment as deforming the portion above central plane MP of electronic component containing substrate 1B is effectively maintained. Therefore, the portions under and above central plane MP of electronic component containing substrate 1A-3 effectively mutually cancel vibrations due to deformation based on the bending moments. Therefore, lessening of vibration by mutual cancellation of vibrations by the portions under and above central plane MP in the direction of thickness of electronic component containing substrate 1A-3 is facilitated and prevention or lessening of generation of audible sound due to the vibration is facilitated.

Third Preferred Embodiment

An electronic component containing substrate 1B according to a third preferred embodiment of the present invention will be described with reference to FIGS. 22 and 23.

Figure 22A:
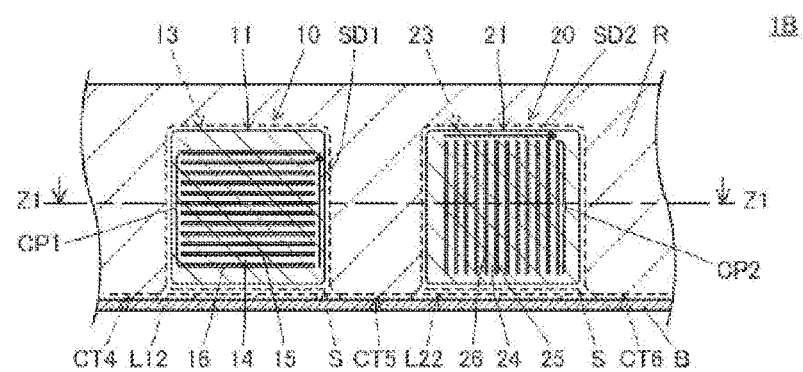
FIGS. 22A and 22B are cross-sectional views of an electronic component containing substrate 1B according to a third preferred embodiment of the present invention, with FIG. 22A showing a cross-sectional view along a surface including the line Y1-Y1 in 22B and FIG. 22B showing a cross-sectional view along a surface including the line Z1-Z1 in 22A.
Figure 22B:
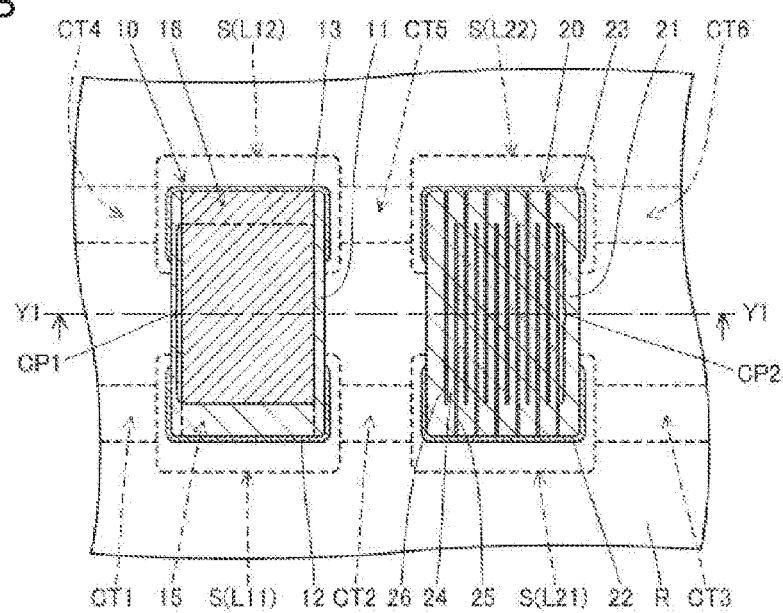

FIG. 22 is a cross-sectional view of electronic component containing substrate 1B. FIG. 22A is a cross-sectional view along a surface including the line Y1-Y1 in FIG. 22B. FIG. 22B is a cross-sectional view along a surface including the line Z1-Z1 in FIG. 22A.

Electronic component containing substrate 1B includes substrate B, first electronic component 10 and second electronic component 20, and embedment layer R. First electronic component 10 and second electronic component 20 are mounted on one main surface of substrate B. Embedment layer R is provided on one main surface of substrate B as embedding first electronic component 10 and second electronic component 20.

Substrate B is a multilayer substrate corresponding to FIG. 44 described previously, and it is shown in a simplified manner with an internal electrode or a via not being shown. Substrate B includes an insulating layer and an interconnection layer as in the multilayer substrate shown in FIG. 44. The insulating layer contains a woven fabric or a nonwoven fabric of glass, silica, or the like and an insulating resin. In a preferred embodiment of the present invention, in order to emphasize first electronic component 10 and second electronic component 20, a relationship in magnitude of substrate B with first electronic component 10 and second electronic component 20 is different from an actual state.

First electronic component 10 includes a multilayer ceramic capacitor including ceramic multilayer body 11 and first external electrode 12 and second external electrode 13. Ceramic multilayer body 11 is structured such that ceramic dielectric layers 14 defining and functioning as protection layers sandwich layered portion CP1 in which capacitor elements having ceramic dielectric layer 14 interposed between first internal electrode 15 and second internal electrode 16 are layered.

Ceramic multilayer body 11 has two opposing end surfaces and side surfaces connecting the two end surfaces to each other. First external electrode 12 is connected to first internal electrode 15 and second external electrode 13 is connected to second internal electrode 16. First external electrode 12 and second external electrode 13 are provided on the surface of ceramic multilayer body 11.

Second electronic component 20 includes a multilayer ceramic capacitor structured similarly to first electronic component 10. Second electronic component 20 includes ceramic multilayer body 21 and first external electrode 22 and second external electrode 23. Ceramic multilayer body 21 is structured such that ceramic dielectric layers 24 defining and functioning as protection layers sandwich layered portion CP2 in which capacitor elements having ceramic dielectric layer 24 interposed between first internal electrode 25 and second internal electrode 26 are layered.

Ceramic multilayer body 21 has two opposing end surfaces and side surfaces connecting the two end surfaces to each other. First external electrode 22 is connected to first internal electrode 25 and second external electrode 23 is connected to second internal electrode 26. First external electrode 22 and second external electrode 23 are provided on the surface of ceramic multilayer body 21.

First electronic component 10 is connected on first mounting land L11 and second mounting land L12, for example, with connection member S such as solder. Similarly, second electronic component 20 is connected on third mounting land L21 and fourth mounting land L22 similarly with connection member S such as solder. A material for first mounting land L11 to fourth mounting land L22 and a material for connection member S can be selected as appropriate from existing materials for use.

First mounting land L11 and third mounting land L21 are on an interconnection including conductive patterns CT1 to CT3 and second mounting land L12 and fourth mounting land L22 are on an interconnection including conductive patterns CT4 to CT6. In FIG. 22B, first electronic component 10 and second electronic component 20 are connected in parallel directly through conductive patterns CT2 and CT5.

Direct connection means that a mounting land on which first electronic component 10 is mounted and a mounting land on which second electronic component 20 is mounted are connected to each other through a conductive pattern so that first electronic component 10 and second electronic component 20 are electrically conducting to each other. Therefore, voltages in phase or substantially in phase are applied to first electronic component 10 and second electronic component 20, respectively.

A side surface of first electronic component 10 and a side surface of second electronic component 20 are opposed to each other with embedment layer R being interposed. In FIGS. 22A and 22B as described above, another electronic component is not mounted between first electronic component 10 and second electronic component 20. Another electronic component, however, may be mounted so long as cancellation of vibrations transmitted from both electronic components which will be described later to embedment layer R is not affected.

First electronic component 10 is mounted on substrate B such that a direction of layering SD1 of ceramic multilayer body 11 is in parallel to a direction of normal to one main surface of substrate B. Second electronic component 20 is mounted on substrate B such that a direction of layering SD2 of ceramic multilayer body 21 is in parallel to one main surface of substrate B. In electronic component containing substrate 1B, direction of layering SD1 of ceramic multilayer body 11 of first electronic component 10 and direction of layering SD2 of ceramic multilayer body 21 of second electronic component 20 are perpendicular to each other. Perpendicular herein encompasses variation in mounting such as inclination of an attitude in mounting of first electronic component 10 and second electronic component 20.

Figure 23A:
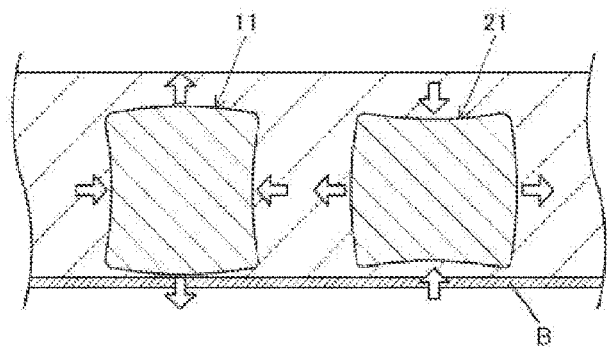
FIGS. 23A and 23B are schematic cross-sectional views illustrating a state of distortion in first electronic component 10 and second electronic component 20 included in electronic component containing substrate 1B shown in FIG. 22 at the time of application of a voltage, with FIG. 23A showing a schematic cross-sectional view corresponding to FIG. 22A and FIG. 23B showing a schematic cross-sectional view corresponding to FIG. 22B.
Figure 23B:
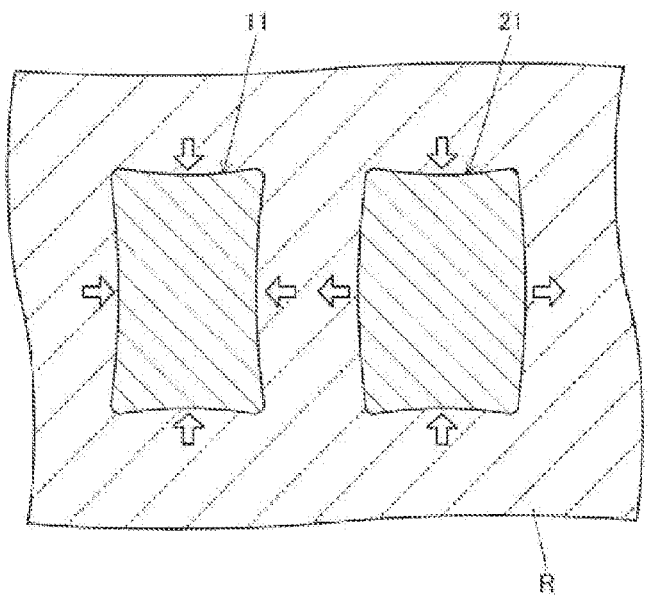

FIG. 23 is a schematic cross-sectional view illustrating a state of distortion in first electronic component 10 and second electronic component 20 included in electronic component containing substrate 1B at the time of application of a voltage. For better understanding of a state of distortion, only a change in outer shape of ceramic multilayer body 11 of first electronic component 10 and ceramic multilayer body 21 of second electronic component 20 is shown as being exaggerated. FIG. 23A is a schematic cross-sectional view corresponding to FIG. 22A. FIG. 23B is a schematic cross-sectional view corresponding to FIG. 22B.

As shown in FIGS. 23A and 23B when a voltage is applied to each electronic component, distortion produced in first electronic component 10 and distortion produced in second electronic component 20 are opposite to each other in direction. Consequently, vibration produced as a result of transmission of distortion produced in first electronic component 10 to embedment layer R and vibration produced as a result of transmission of distortion produced in second electronic component 20 to embedment layer R mutually cancel each other. Even when distortion due to application of a voltage is produced in each electronic component embedded in embedment layer R, transmission of vibration through embedment layer R is decreased.

First Modification of Third Preferred Embodiment

An electronic component containing substrate 1B-1 representing a first modification of electronic component containing substrate 1B will be described with reference to FIG. 24.

Figure 24:
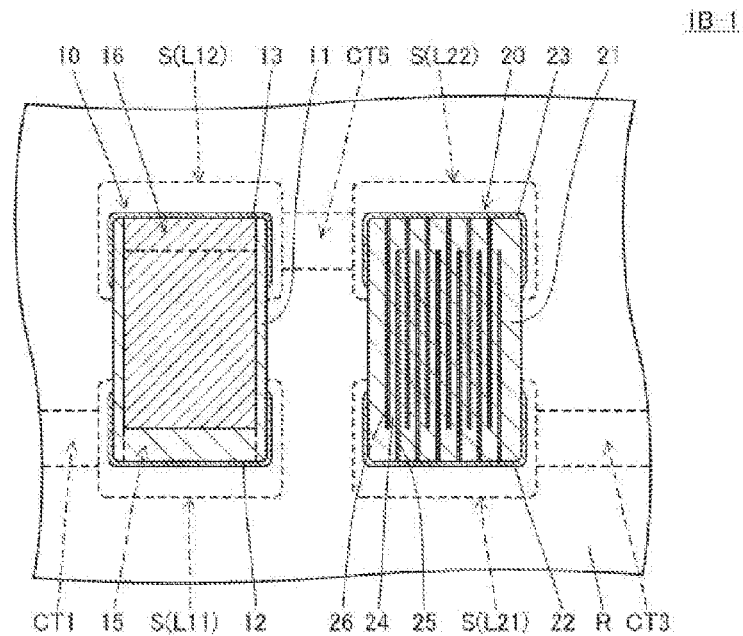
FIG. 24 is a cross-sectional view corresponding to FIG. 22B, of an electronic component containing substrate 1B-1 representing a first modification of electronic component containing substrate 1B shown in FIG. 22.

FIG. 24 is a cross-sectional view corresponding to FIG. 22B, of electronic component containing substrate 1B-1. In FIG. 24, first mounting land L11 and second mounting land L12 as well as third mounting land L21 and fourth mounting land L22 are on an interconnection including conductive patterns CT1, CT5, and CT3. In FIG. 24, first electronic component 10 and second electronic component 20 are connected in series directly through conductive pattern CT5. Therefore, as in electronic component containing substrate 1B, voltages in phase or substantially in phase are applied to first electronic component 10 and second electronic component 20, respectively.

Second Modification of Third Preferred Embodiment

An electronic component containing substrate 1B-2 representing a second modification of electronic component containing substrate 1B will be described with reference to FIGS. 25 and 26.

Figure 25:
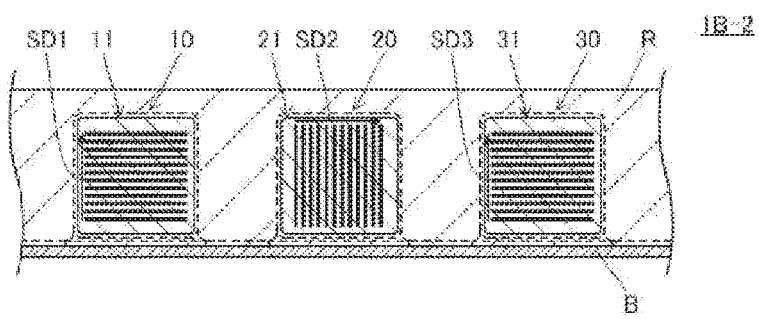
FIG. 25 is a cross-sectional view corresponding to FIG. 22A, of an electronic component containing substrate 1B-2 representing a second modification of electronic component containing substrate 1B shown in FIG. 22.

FIG. 25 is a cross-sectional view corresponding to FIG. 22A, of electronic component containing substrate 1B-2. Electronic component containing substrate 1B-2 further includes third electronic component 30 in addition to electronic component containing substrate 1B. First electronic component 10 and third electronic component 30 are each preferably a similarly structured multilayer ceramic capacitor. Substrate B is shown in a simplified manner as in each preferred embodiment described previously.

Direction of layering SD1 of ceramic multilayer body 11 of first electronic component 10 and a direction of layering SD3 of a ceramic multilayer body 31 of third electronic component 30 are in parallel to a direction of normal to one main surface of substrate B. Direction of layering SD2 of ceramic multilayer body 21 of second electronic component 20 is in parallel to one main surface of substrate B. Direction of layering SD1 of ceramic multilayer body 11 of first electronic component 10 and direction of layering SD3 of ceramic multilayer body 31 of third electronic component 30 are perpendicular to direction of layering SD2 of ceramic multilayer body 21 of second electronic component 20.

Figure 26:
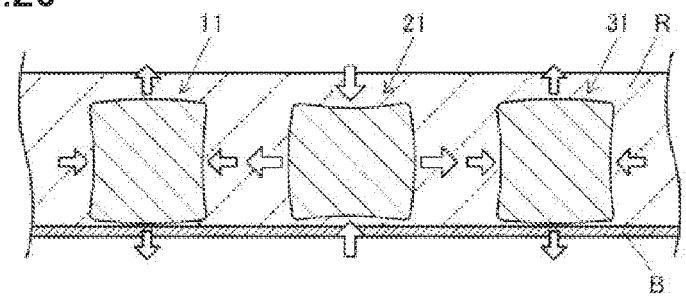
FIG. 26 is a schematic cross-sectional view illustrating a state of distortion in first electronic component 10, second electronic component 20, and a third electronic component 30 included in electronic component containing substrate 1B-2 shown in FIG. 25 at the time of application of a voltage.

FIG. 26 is a schematic cross-sectional view illustrating a state of distortion in first electronic component 10, second electronic component 20, and third electronic component 30 included in electronic component containing substrate 1B-2 at the time of application of a voltage. As in FIG. 23 described previously, for better understanding of a state of distortion, only a change in outer shape of ceramic multilayer body 11 of first electronic component 10, ceramic multilayer body 21 of second electronic component 20, and ceramic multilayer body 31 of third electronic component 30 is shown as being exaggerated.

As shown in FIG. 26, when a voltage is applied to each electronic component, distortion produced in first electronic component 10 and third electronic component 30 and distortion produced in second electronic component 20 are opposite in direction to each other. First electronic component 10, second electronic component 20, and third electronic component 20 are set such that vibration based on first electronic component 10 and third electronic component 30 and vibration based on second electronic component 20 mutually cancel each other.

In electronic component containing substrate 1B-2, vibration based on one electronic component (second electronic component 20) is canceled by vibration based on two electronic components (first electronic component 10 and third electronic component 30). In general, of an amount of distortion produced at the time of application of a voltage to a multilayer ceramic capacitor, an amount of expansion in the direction of layering of a ceramic multilayer body is greater than an amount of contraction in the direction perpendicular to the direction of layering of the ceramic multilayer body. Therefore, by setting the number of first electronic components 10 to be greater than the number of second electronic components 20, vibrations is able to more effectively mutually be canceled.

A ratio between the number of first electronic components 10 and the number of second electronic components 20 is not limited to 2:1 shown in FIGS. 25 and 26 and modified as appropriate depending on an amount of distortion produced in each electronic component. An amount of distortion produced in each electronic component is also dependent on a relative permittivity of a ceramic dielectric layer and the number of layered capacitor elements. Therefore, a ratio between the number of first electronic components 10 and the number of second electronic components 20 is selected such that vibrations are effectively mutually canceled as a whole also in view of a direction of an amount of distortion.

Figure 27:
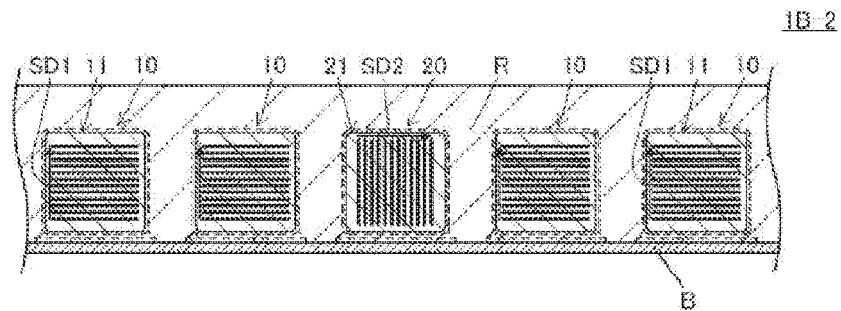
FIG. 27 is a cross-sectional view corresponding to FIG. 22A, of a further modification of electronic component containing substrate 1B-2 shown in FIG. 25.

For example, a plurality of first electronic components 10 may be mounted on each of left and right sides of one second electronic component 20. FIG. 27 shows an example in which two first electronic components 10 are mounted on each of the left and right sides of one second electronic component 20 and a ratio between the number of first electronic components 10 and the number of second electronic components 20 is set to 4:1 as a further modification of electronic component containing substrate 1B-2.

As in electronic component containing substrate 1B, even when distortion due to application of a voltage is produced in each electronic component embedded in embedment layer R, transmission of vibration through embedment layer R is decreased.

Third Modification of Third Preferred Embodiment

An electronic component containing substrate 1B-3 representing a third modification of electronic component containing substrate 1B will be described with reference to FIG. 28.

Figure 28:
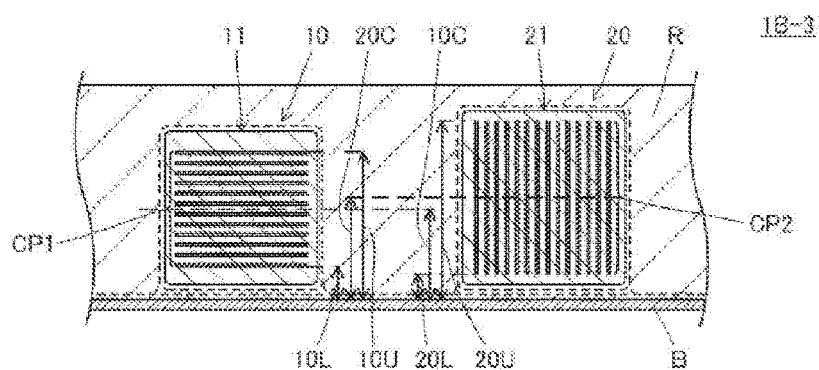
FIG. 28 is a cross-sectional view corresponding to FIG. 22A, of an electronic component containing substrate 1B-3 representing a third modification of electronic component containing substrate 1B shown in FIG. 22.

FIG. 28 is a cross-sectional view corresponding to FIG. 22A, of electronic component containing substrate 1B-3. As shown in FIG. 28, in electronic component containing substrate 1B-3, first electronic component 10 is different in size from second electronic component 20. Substrate B is shown in a simplified manner as in each preferred embodiment described previously.

In electronic component containing substrate 1B-3, with one main surface of substrate B being defined as the reference surface, a height 10C of a center of layered portion CP1 of first electronic component 10 is intermediate between a height 20L of a lowest portion and a height 20U of a highest portion of layered portion CP2 of second electronic component 20. A height 20C of a center of layered portion CP2 of second electronic component 20 is intermediate between a height 10L of a lowest portion and a height 10U of a highest portion of layered portion CP1 of first electronic component 10. In electronic component containing substrate 1B-3, height 10C of the center of layered portion CP1 of first electronic component 10 is within an extent in a direction of height of layered portion CP2 of second electronic component 20. Height 20C of the center of layered portion CP2 of second electronic component 20 is within an extent in a direction of height of layered portion CP1 of first electronic component 10.

As described previously, the layered portion is a portion where capacitor elements having a ceramic dielectric layer interposed between two internal electrodes are layered, which is involved with exhibition of a capacitance in the multilayer ceramic capacitor. The layered portion is also a vibration generation source where, with application of a voltage, owing to an electrostriction effect and an inverse piezoelectric effect, distortion in accordance with magnitude of an applied voltage is produced.

Therefore, when the condition described above is satisfied, height positions from one main surface of substrate B of two vibration generation sources are substantially superimposed on each other. In other words, vibration produced as a result of transmission of distortion produced in first electronic component 10 to embedment layer R and vibration produced as a result of transmission of distortion produced in second electronic component 20 to embedment layer R effectively interfere with each other without passing by each other. Consequently, even when first electronic component 10 and second electronic component 20 are different in size from each other, vibrations based on the electronic components reliably mutually cancel each other. Even when distortion due to application of a voltage is produced in each electronic component embedded in embedment layer R, transmission of vibration through embedment layer R is decreased.

A method for manufacturing electronic component containing substrate 1B is basically in conformity with the mounting step and the embedment layer forming step in the method for manufacturing electronic component containing substrate 1 described previously.

In the mounting step, first electronic component 10 and second electronic component 20 are mounted such that direction of layering SD1 of ceramic dielectric layer 14, first internal electrode 15, and second internal electrode 16 in first electronic component 10 is perpendicular to direction of layering SD2 of ceramic dielectric layer 24, first internal electrode 25, and second internal electrode 26 in second electronic component 20.

In the embedment layer forming step, embedment layer R is provided such that a side surface of first electronic component 10 and a side surface of second electronic component 20 are opposed to each other with embedment layer R being interposed. According to the method for manufacturing an electronic component containing substrate, electronic component containing substrate 1B achieving lessening of vibration of substrate B and achieving prevention or lessening of generation of audible sound due to the vibration of substrate B can efficiently be manufactured.

Fourth Preferred Embodiment

An electronic component containing substrate 1C according to a fourth preferred embodiment of the present invention will be described with reference to FIGS. 29 and 30.

Figure 29:
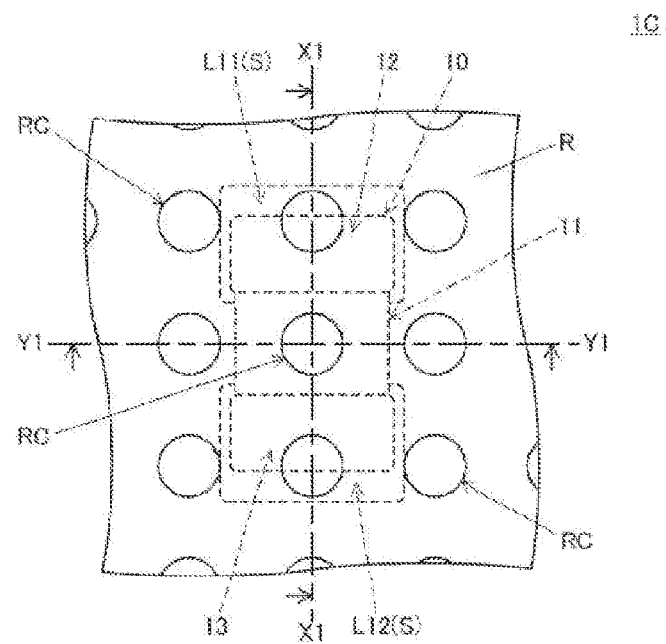
FIG. 29 is a top view of an electronic component containing substrate 1C according to a fourth preferred embodiment of the present invention.
Figure 30A:
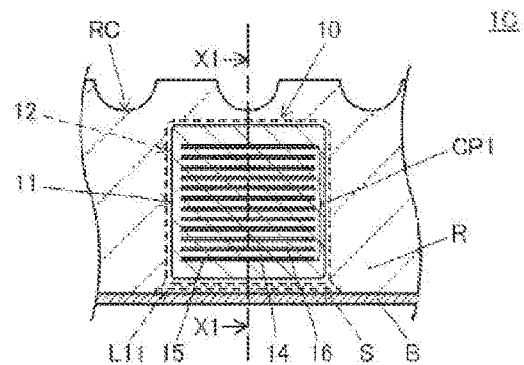
FIGS. 30A and 30B are cross-sectional views of an electronic component containing substrate 1C shown in FIG. 29, with FIG. 30A showing a cross-sectional view along a surface including the line Y1-Y1 in FIG. 29 and FIG. 30B showing a cross-sectional view along a surface including the line X1-X1 in FIG. 29.
Figure 30B:
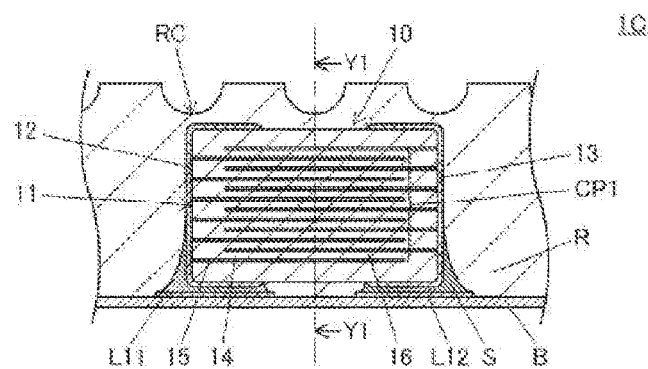

FIG. 29 is a top view of electronic component containing substrate 1C. FIG. 30A is a cross-sectional view along a surface including the line Y1-Y1 in FIG. 29. FIG. 30B is a cross-sectional view along a surface including the line X1-X1 in FIG. 29.

Electronic component containing substrate 1C includes substrate B, first electronic component 10, and embedment layer R. First electronic component 10 is mounted on one main surface of substrate B. Embedment layer R is provided on one main surface of substrate B as embedding first electronic component 10.

Substrate B is a multilayer substrate corresponding to FIG. 44 described previously, and it is shown in a simplified manner with an internal electrode or a via not being shown. Substrate B includes an insulating layer and an interconnection layer as in the multilayer substrate shown in FIG. 44. The insulating layer contains a woven fabric or a nonwoven fabric of glass, silica, or the like and an insulating resin. In the first preferred embodiment of the present invention, in order to emphasize first electronic component 10, a relationship in magnitude between substrate B and first electronic component 10 is different from an actual state.

First electronic component 10 includes a multilayer ceramic capacitor including ceramic multilayer body 11 and first external electrode 12 and second external electrode 13. Ceramic multilayer body 11 is structured such that ceramic dielectric layers 14 defining and functioning as protection layers sandwich layered portion CP1 in which capacitor elements having ceramic dielectric layer 14 interposed between first internal electrode 15 and second internal electrode 16 are layered.

Ceramic multilayer body 11 has two opposing end surfaces and side surfaces connecting the two end surfaces to each other. First external electrode 12 is connected to first internal electrode 15 and second external electrode 13 is connected to second internal electrode 16. First external electrode 12 and second external electrode 13 are provided on the surface of ceramic multilayer body 11.

In FIGS. 30A and 30B first electronic component 10 is connected on first mounting land L11 and second mounting land L12, for example, with connection member S such as solder. A material for first mounting land L11 and second mounting land L12 and a material for connection member S can be selected as appropriate from existing materials for use. First mounting land L11 and second mounting land L12 are on an interconnection including a not-shown conductive pattern. A voltage is applied to first electronic component 10 through this interconnection.

A plurality of first electronic components 10 may be mounted on electronic component containing substrate 1C so long as suppression of transmission of vibration of first electronic component 10 through embedment layer R owing to a recess portion RC which will be described later is not affected. Similarly, an electronic component other than a multilayer ceramic capacitor may be mounted on electronic component containing substrate 1C.

An outer surface of embedment layer R includes recess portion RC. Recess portion RC is provided to lessen vibration of electronic component containing substrate 1C produced as a result of distortion in first electronic component 10 at the time of application of a voltage in a range from 20 Hz to 20 kHz representing an audible frequency range. Though recess portions RC in a semi-spherical form are provided at equal or substantially equal intervals in the outer surface of embedment layer R in FIGS. 30A and 30B, the arrangement is not limited as such so long as they are in such forms and positions as exhibiting the following mechanism, and recess portions can be provided in various forms as will be described later.

Since first electronic component 10 includes a multilayer ceramic capacitor and a ceramic material high in dielectric constant basically composed of barium titanate is often used for the same, the first electronic component may vibrate due to distortion caused at the time of application of a voltage. Though vibration is transmitted to substrate B to which first electronic component 10 is connected with connection member S being interposed, vibration is transmitted to substrate B also through embedment layer R when first electronic component 10 is embedded in embedment layer R.

When the outer surface of embedment layer R has no recess portion RC, there is nothing to suppress transmission of vibration of first electronic component 10 through embedment layer R. Consequently, resonance of substrate B to which vibration of first electronic component 10 is transmitted occurs and the substrate may significantly vibrate in the audible frequency range. When recess portion RC is provided in the outer surface of embedment layer R, recess portion RC suppresses transmission of vibration of first electronic component 10 through embedment layer R. Consequently, it is expected that resonance of substrate B no longer occurs, amplitude of substrate B is made smaller even if resonance occurs, or a resonance frequency is out of the audible frequency range.

With recess portion RC being provided in the surface of embedment layer R such that the resonance frequency is out of the audible frequency range, even when vibration of substrate B out of the audible frequency range becomes great, vibration will not be felt as what is called "acoustic noise."

In any of the cases above, great vibration of substrate B in the audible frequency range is suppressed. Therefore, vibration of substrate B in the audible frequency range which is produced as a result of distortion in first electronic component 10 at the time of application of a voltage is decreased and generation of audible sound is able to be prevented or decreased. The mechanism above is an estimation and such lessening may be brought about also by another mechanism.

One non-limiting example of a method for manufacturing electronic component containing substrate 1C according to the fourth preferred embodiment of the present invention will be described with reference to FIGS. 31A to 34B. FIGS. 31A to 34B are diagrams schematically showing the mounting step, the embedment layer forming step, a recess portion form determining step, and a recess portion providing step successively performed in one example of the method for manufacturing electronic component containing substrate 1C, respectively. Each of FIGS. 31A to 34B corresponds to a cross-sectional view along the surface including the line Y1-Y1 in FIG. 29.

Figure 31A:
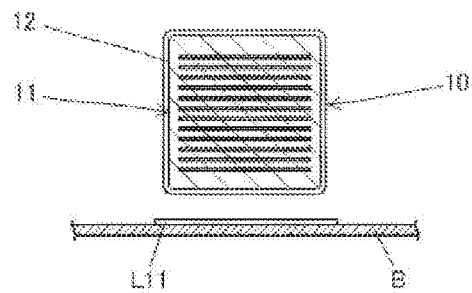
FIGS. 31A and 31B are diagrams schematically showing a mounting step for illustrating one example of a method for manufacturing electronic component containing substrate 1C shown in FIGS. 29 and 30.
Figure 31B:
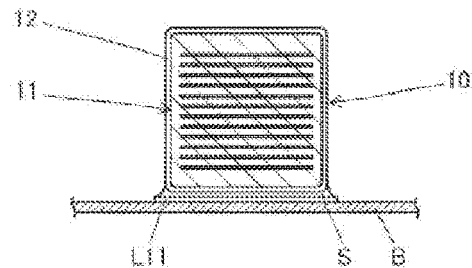

FIGS. 31A and 31B are diagrams schematically showing the mounting step in the method for manufacturing electronic component containing substrate 1C. In the mounting step, first electronic component 10 is mounted on one main surface of substrate B.

FIG. 31A shows a stage of preparation of first electronic component 10 and substrate B on which first electronic component 10 is to be mounted. As described previously, first electronic component 10 includes a multilayer ceramic capacitor including first external electrode 12 and second external electrode 13 on the surface of ceramic multilayer body 11 in which distortion is produced at the time of application of a voltage. Substrate B includes first mounting land L11 and second mounting land L12 (L12 not shown) for connection of first electronic component 10 on one main surface. FIG. 31B shows a stage of mounting of first electronic component 10 on one main surface of substrate B by joining first electronic component 10 to first mounting land L11 and second mounting land L12 with connection member S such as solder.

Figure 32A:
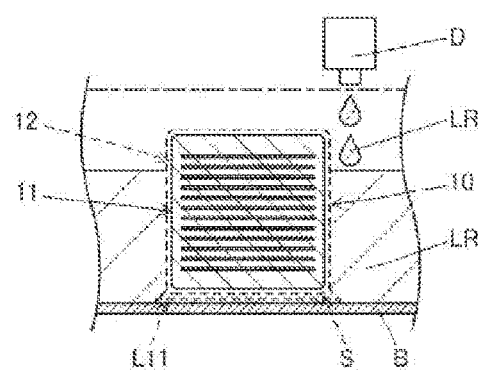
FIGS. 32A and 32B are diagrams schematically showing an embedment layer forming step for illustrating one example of the method for manufacturing electronic component containing substrate 1C shown in FIGS. 29 and 30.
Figure 32B:
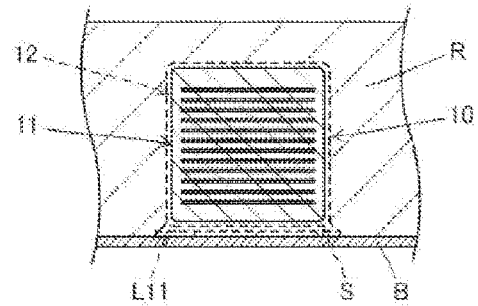

FIGS. 32A and 32B are diagrams schematically showing the embedment layer forming step in the method for manufacturing electronic component containing substrate 1C. In the embedment layer forming step, embedment layer R is provided on one main surface of substrate B as embedding first electronic component 10.

FIG. 32A shows a stage of application of liquid resin LR to one main surface of substrate B on which first electronic component 10 is mounted, for example, with dispenser d, to a prescribed thickness shown with a chain dotted line. An apparatus used for application is not limited to dispenser d and an existing application apparatus can be used. For example, various coaters such as a curtain coater and a spin coater may be used. Liquid resin LR is not limited to a resin composed of a single resin material, and a resin containing a glass material or silica as a filler in a resin material can be used.

Embedment layer R may be formed by placing a prepreg in a form of a sheet in a semi-cured state on one main surface of substrate B and pressing the prepreg so as to embed first electronic component 10, without being limited to a method of application of liquid resin LR as in FIG. 32A.

FIG. 32B shows a stage of obtaining cured embedment layer R by heating and curing liquid resin LR in which first electronic component 10 has been embedded.

Figure 33A:
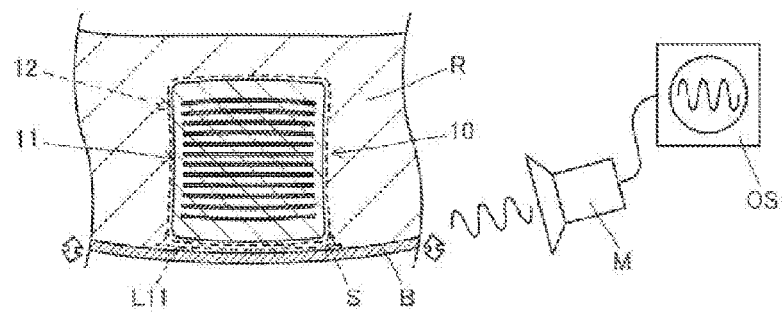
FIGS. 33A-33C are diagrams schematically showing a recess portion form determining step for illustrating one example of the method for manufacturing electronic component containing substrate 1C shown in FIGS. 29 and 30.
Figure 33B:
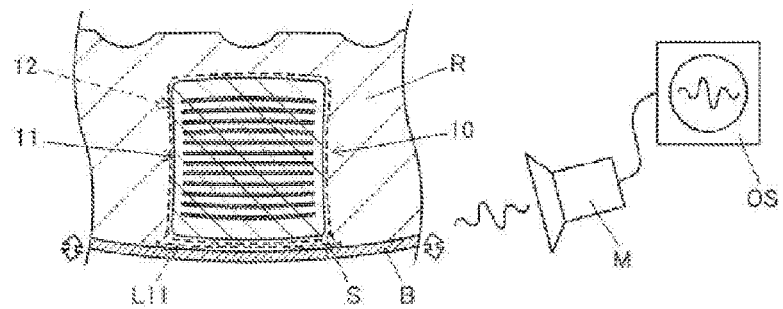
Figure 33C:
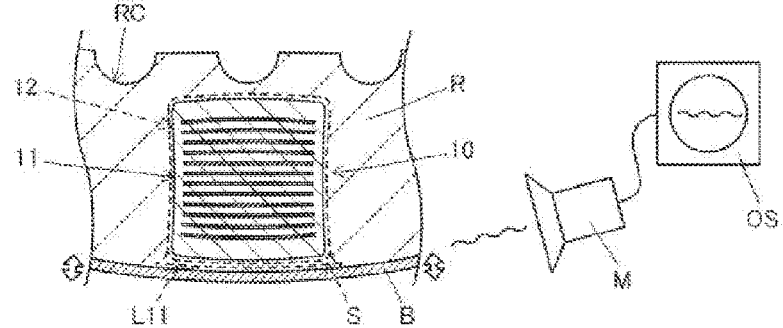

FIGS. 33A-33C are diagrams schematically showing the recess portion form determining step in the method for manufacturing electronic component containing substrate 1C. In the recess portion form determining step, a form of recess portion to be provided in the recess portion providing step which will be described later is determined.

FIG. 33A shows a stage of generation of vibration by applying an alternating-current voltage having a prescribed frequency and amplitude to the electronic component containing substrate subjected to the embedment layer forming step, measurement of produced vibration as sound with a microphone M, and representation of a sound pressure with an oscilloscope OS. Since no recess portion RC which will be described later has been provided in the outer surface of embedment layer R at this stage, loud sound in the audible frequency range is measured from the electronic component containing substrate.

A method of measurement of vibration which has occurred is not limited to the method using microphone M and oscilloscope OS as above. For example, displacement of the electronic component containing substrate may be measured with a laser displacement meter and vibration may be found from a period of displacement. In this case, since which portion of the electronic component containing substrate has greatly displaced can also be determined, a position to provide a recess portion in the recess portion providing step which will be described later, which is effective for suppression of vibration, is able to be determined.

FIG. 33B shows a stage of experimental provision of a recess portion in the outer surface of embedment layer R based on a result of measurement in FIG. 33A. A recess portion can be provided, for example, by emitting laser beams LB from a laser processing machine LM and digging the outer surface of embedment layer R as shown in the recess portion providing step which will be described later. When the provided recess portion is not sufficient to exhibit the mechanism described previously, sound generated from the electronic component containing substrate has not yet become sufficiently low at this stage, although it has become lower than in FIG. 33A.

FIG. 33C shows a stage that the recess portion provided in the outer surface of embedment layer R is made deeper based on a result of measurement in FIG. 33B. At this stage, provided recess portion RC is sufficient to exhibit the mechanism described previously and sound generated from the electronic component containing substrate has sufficiently become low. Such recess portion RC is hereafter provided in the outer surface of embedment layer R of the electronic component containing substrate.

The recess portion form determining step may be performed by using some of a group of electronic component containing substrates 1C to be provided as actual products or by using some of a group of experimentally fabricated electronic component containing substrates different from actual products. The recess portion form determining step may be performed, for example, by calculating variation in vibration of the electronic component containing substrate in an audible frequency range with change in the form of provision of the recess portion through simulation based on the finite-element method, rather than being experimentally performed.

Figure 34A:
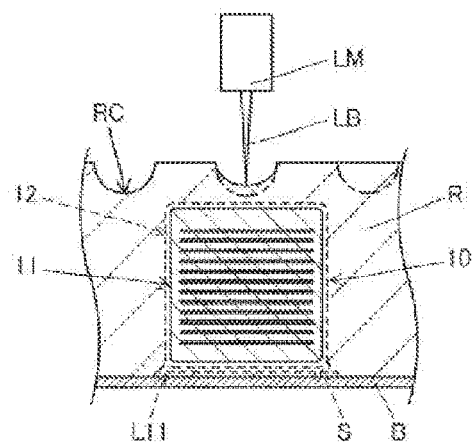
FIGS. 34A and 34B are diagrams schematically showing a recess portion providing step for illustrating one example of the method for manufacturing electronic component containing substrate 1C shown in FIGS. 29 and 30.
Figure 34B:
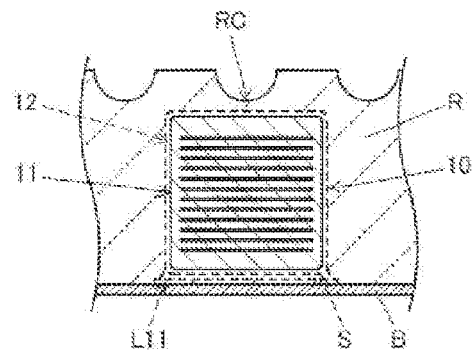

FIGS. 34A and 34B are diagrams schematically showing the recess portion providing step in the method for manufacturing electronic component containing substrate 1C. In the recess portion providing step, recess portion RC is provided in the outer surface of embedment layer R so as to lessen vibration of the electronic component containing substrate produced as a result of distortion in first electronic component 10 at the time of application of a voltage.

FIG. 34A shows a stage that recess portion RC in a form determined in the recess portion form determining step is worked by emitting laser beams LB from laser processing machine LM and digging the outer surface of embedment layer R. An apparatus used to dig the outer surface of embedment layer R is not limited to laser processing machine LM but an existing processing machine can be used. For example, a drill, a dicing saw, and a sand blasting apparatus may be used.

FIG. 34B shows a stage that recess portion RC is provided in the outer surface of embedment layer R to lessen vibration of the electronic component containing substrate produced as a result of distortion in first electronic component 10 at the time of application of a voltage and electronic component containing substrate 1C is completed. Recess portions RC do not have to be provided at equal intervals in the entire upper surface of embedment layer R but should only be provided at positions effective to lessen vibration of the electronic component containing substrate.

Through the steps above, electronic component containing substrate 1C in which vibration in an audible frequency range is decreased and generation of audible sound is prevented or decreased is efficiently manufactured. Once the recess portion form determining step is performed in the method for manufacturing electronic component containing substrate 1C described above, it does not have to repeatedly be performed for an electronic component containing substrate the same in construction. Alternatively, a form of a recess portion which will lessen vibration of the electronic component containing substrate may be expected, electronic component containing substrate 1C having such recess portion RC in the outer surface of embedment layer R may be fabricated through the recess portion providing step, and thereafter produced vibration may be checked. In this case, the recess portion form determining step does not have to be performed and a process can proceed from the embedment layer forming step to the recess portion providing step.

Figure 35A:
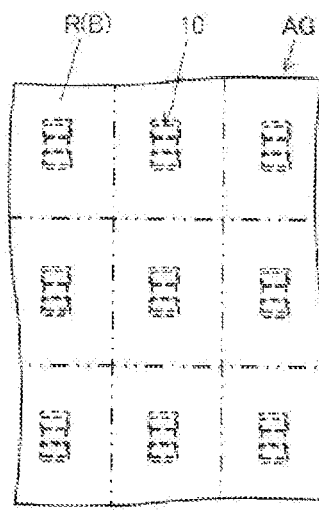
FIGS. 35A-35C illustrate another example of the method for manufacturing electronic component containing substrate 1C shown in FIGS. 29 and 30 and schematically shows an example in which the recess portion providing step is performed with substrate B being formed from an assembly AG and thereafter the substrate is divided into electronic component containing substrates 1C.
Figure 35C:
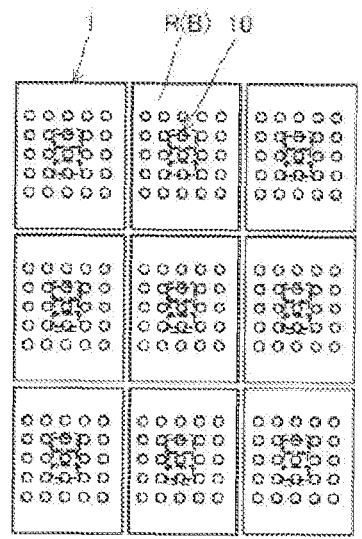
Figure 35B:
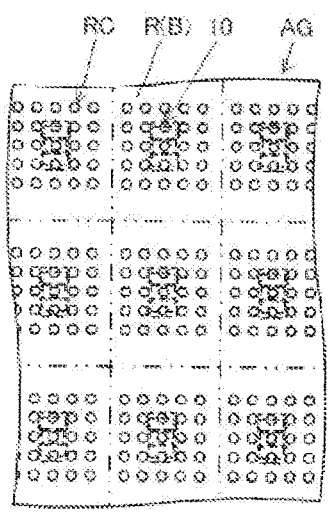

Electronic component containing substrate 1C according to the fourth preferred embodiment of the present invention can also be obtained by performing the recess portion providing step with substrate B being made of an assembly AG as shown in FIGS. 35A-35C.

FIG. 35A shows a stage that embedment layer R is provided on one main surface as embedding first electronic components 10 with substrate B being made of assembly AG. A mounted electronic component other than first electronic component 10 is not shown. FIG. 35B shows a stage that the recess portion providing step is performed in that state and recess portions RC are provided. FIG. 35C shows a stage that the substrate is divided into individual electronic component containing substrates 1C along division lines shown with a chain double dotted line in FIG. 35B after recess portions RC are provided. In this case, electronic component containing substrates 1C is able to be efficiently manufactured.

Figure 36A:
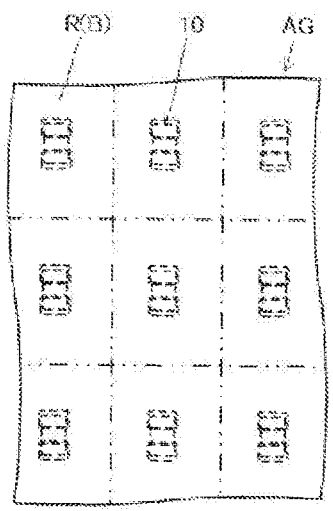
FIGS. 36A-36C illustrate another example of the method for manufacturing electronic component containing substrate 1C shown in FIGS. 29 and 30 and schematically shows an example in which assembly AG is divided into individual substrates B and the individual substrate is subjected to the recess portion providing step to obtain electronic component containing substrate 1C.
Figure 36C:
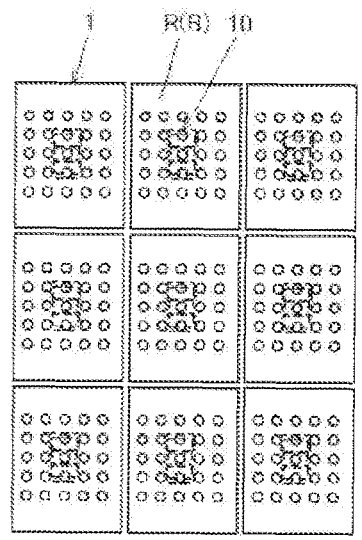
Figure 36B:
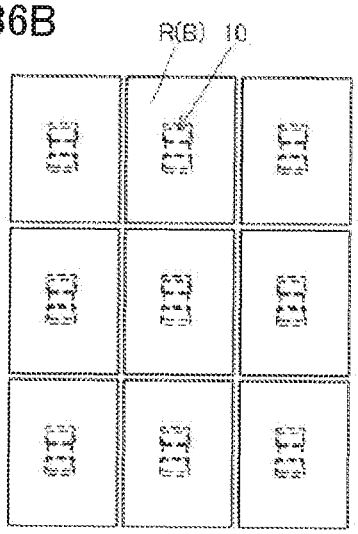

Electronic component containing substrate 1C according to the fourth preferred embodiment of the present invention can also be obtained by dividing assembly AG into individual substrates B and thereafter subjecting the individual substrates to the recess portion providing step as shown in FIGS. 36A-36C.

FIG. 36A shows a stage that embedment layer R is provided on one main surface as embedding first electronic components 10 with substrate B being made of assembly AG as in FIG. 35A. A mounted electronic component other than first electronic component 10 is similarly not shown. FIG. 36B shows a stage that the substrate is divided into individual substrates B along division lines shown with a chain double dotted line in FIG. 36A. FIG. 36C shows a stage of obtaining electronic component containing substrates 1C by subjecting individual divided substrates B to the recess portion providing step and providing recess portions RC. In this case, since how to provide recess portions RC can finely be adjusted in accordance with a state of vibration of an individual electronic component containing substrate, electronic component containing substrate 1C extremely less in variation in quality can be obtained.

First Modification of Fourth Preferred Embodiment

An electronic component containing substrate 1C-1 representing a first modification of electronic component containing substrate 1C will be described with reference to FIGS. 37 and 38. Though electronic component containing substrate 1C-1 is different from electronic component containing substrate 1C in the form of recess portion RC, it is otherwise common thereto and hence description of a common portion will not be provided.

Figure 37:
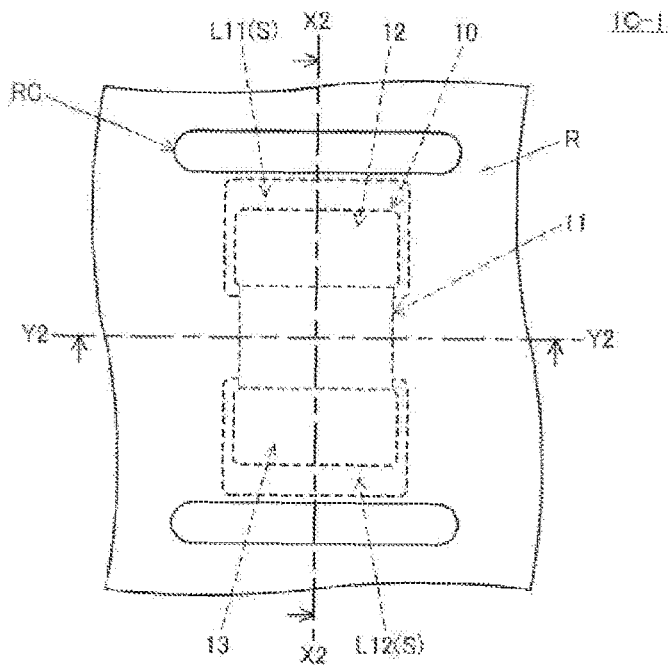
FIG. 37 is a top view of an electronic component containing substrate 1C-1 representing a first modification of electronic component containing substrate 1C shown in FIGS. 29 and 30.
Figure 38A:
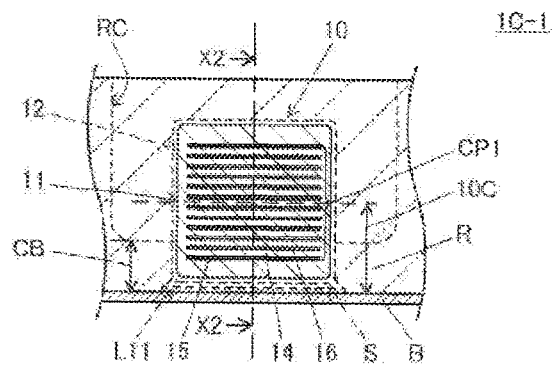
FIGS. 38A and 38B are cross-sectional views of an electronic component containing substrate 1C-1 shown in FIG. 37, with FIG. 38A showing a cross-sectional view along a surface including the line Y2-Y2 in FIG. 37 and FIG. 38B showing a cross-sectional view along a surface including the line X2-X2 in FIG. 37.
Figure 38B:
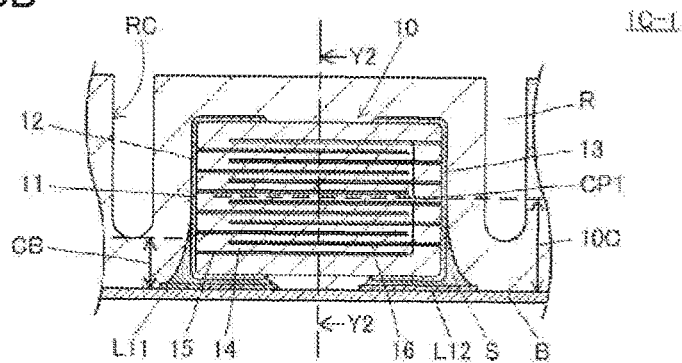

FIG. 37 is a top view of electronic component containing substrate 1C-1. FIG. 38A is a cross-sectional view along a surface including the line Y2-Y2 in FIG. 37. FIG. 38B is a cross-sectional view along a surface including the line X2-X2 in FIG. 37.

In electronic component containing substrate 1C-1, recess portion RC is in a form of a groove provided to be perpendicular to a direction (a longitudinal direction) in which two opposing end surfaces of ceramic multilayer body 11 are virtually connected to each other, in the vicinity of the end surface of first electronic component 10. With one main surface of substrate B being defined as the reference surface, a height CB of a lowest portion of recess portion RC is lower than height 10C of the center of layered portion CP1 of first electronic component 10.

Figure 46A:
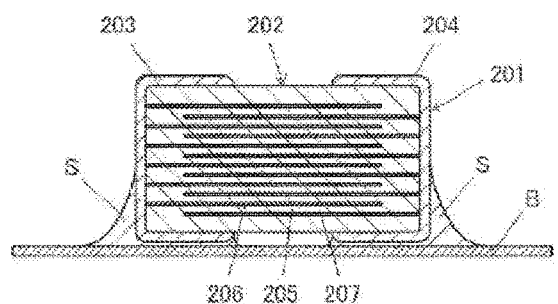
FIGS. 46A and 46B is a cross-sectional view of a state that multilayer ceramic capacitor 201 is mounted on substrate B for illustrating the problem to be solved by preferred embodiments of the present invention, with FIG. 46A showing a state that a voltage is not applied and FIG. 46B showing a schematic cross-sectional view illustrating a state of distortion when a voltage is applied.
Figure 46B:
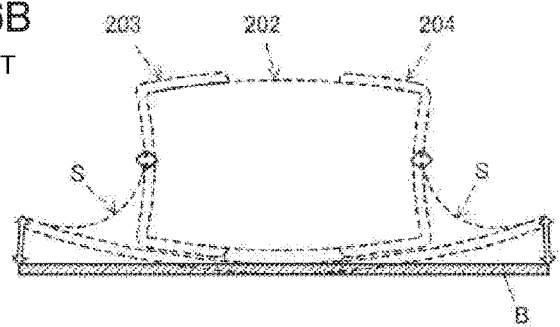

Referring to FIG. 46B, distortion in first electronic component 10 at the time of application of a voltage is assumed to be greatest in the vicinity of the center of layered portion CP1 of first electronic component 10 in a direction of height with one main surface of substrate B being defined as the reference surface. In other words, embedment layer R around this portion deforms to the greatest extent and transmits vibration of first electronic component 10 to substrate B. By providing a space by providing recess portion RC such that height CB of the lowest portion of recess portion RC is lower than height 10C of the center of layered portion CP1 of first electronic component 10, a portion of embedment layer R which greatly deforms can be isolated from other portions.

In first electronic component 10 including the multilayer ceramic capacitor, vibration significantly affecting "acoustic noise" described previously is generally vibration on a longitudinal side (see FIG. 46B). Therefore, by providing a space by providing recess portion RC in a form of a groove as being perpendicular to the longitudinal direction of first electronic component 10, transmission of vibration of first electronic component 10 through embedment layer R is more effectively suppressed.

Though recess portion RC in a form of a groove is provided in electronic component containing substrate 1C-1 shown in FIGS. 37 and 38, the recess portion is not limited as such and it may be provided as a columnar hole. In that case, recess portion RC is preferably arranged in the vicinity of a portion where embedment layer R deforms to the greatest extent at the time of application of a voltage to first electronic component 10 as described above. A plurality of such holes may be provided.

Second Modification of Fourth Preferred Embodiment

An electronic component containing substrate 1C-2 representing a second modification of electronic component containing substrate 1C will be described with reference to FIGS. 39 and 40. Though electronic component containing substrate 1C-2 is different from electronic component containing substrate 1C-1 in position where recess portion RC is provided, it is otherwise common thereto and hence description of a common portion will not be provided.

Figure 39:
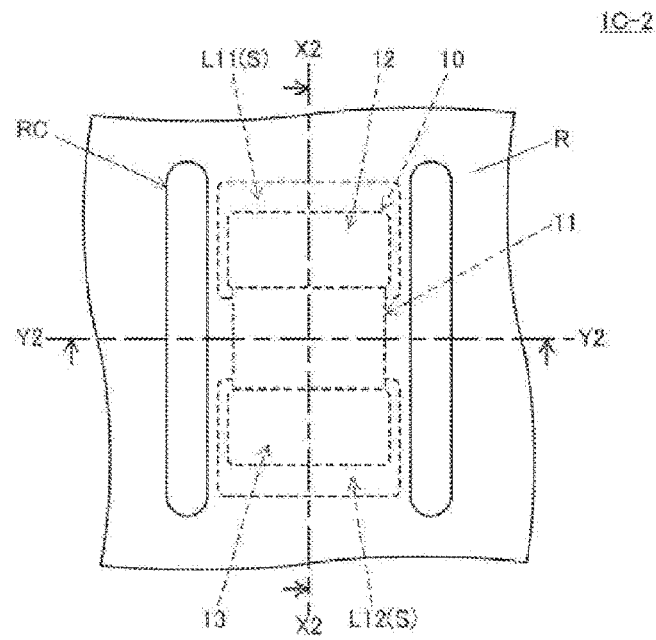
FIG. 39 is a top view of an electronic component containing substrate 1C-2 representing a second modification of electronic component containing substrate 1C shown in FIGS. 29 and 30.
Figure 40A:
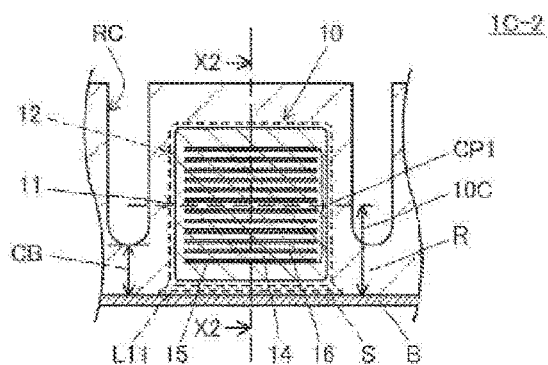
FIGS. 40A and 40B are cross-sectional views of an electronic component containing substrate 1C-2 shown in FIG. 39, with FIG. 40A showing a cross-sectional view along a surface including the line Y2-Y2 in FIG. 39 and FIG. 40B showing a cross-sectional view along a surface including the line X2-X2 in FIG. 39.
Figure 40B:
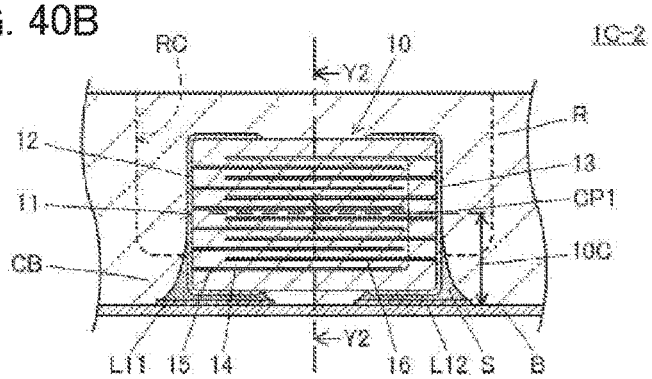

FIG. 39 is a top view of electronic component containing substrate 1C-2. FIG. 40A is a cross-sectional view along a surface including the line Y2-Y2 in FIG. 39. FIG. 40B is a cross-sectional view along a surface including the line X2-X2 in FIG. 39.

In electronic component containing substrate 1C-2, recess portion RC is in a form of a groove provided in parallel to a side surface of ceramic multilayer body 11, in the vicinity of the side surface of first electronic component 10. With one main surface of substrate B being defined as the reference surface as in electronic component containing substrate 1C-1, height CB of the lowest portion of recess portion RC is lower than height 10C of the center of layered portion CP1 of first electronic component 10.

Depending on how first electronic component 10 is mounted on substrate B, vibration in a direction perpendicular to the side surface of ceramic multilayer body 11 may significantly affect "acoustic noise" described previously. In such a case, by providing a space by providing recess portion RC in a form of a groove as in electronic component containing substrate 1C-1, a portion of embedment layer R which greatly deforms in the vicinity of the side surface of ceramic multilayer body 11 is able to be isolated from other portions.

Recess portion RC in a form of a groove may be provided in the vicinity of both of an end surface and a side surface of first electronic component 10. In any case, the recess portion is preferably located in the vicinity of a portion where embedment layer R deforms to the greatest extent at the time of application of a voltage to first electronic component 10.

Third Modification of Fourth Preferred Embodiment

An electronic component containing substrate 1C-3 representing a third modification of electronic component containing substrate 1C will be described with reference to FIGS. 41 and 42. Since electronic component containing substrate 1C-3 is common to electronic component containing substrates 1C, 1C-1, and 1C-2 up to a form of recess portion RC, description of a common portion will not be provided.

Figure 41:
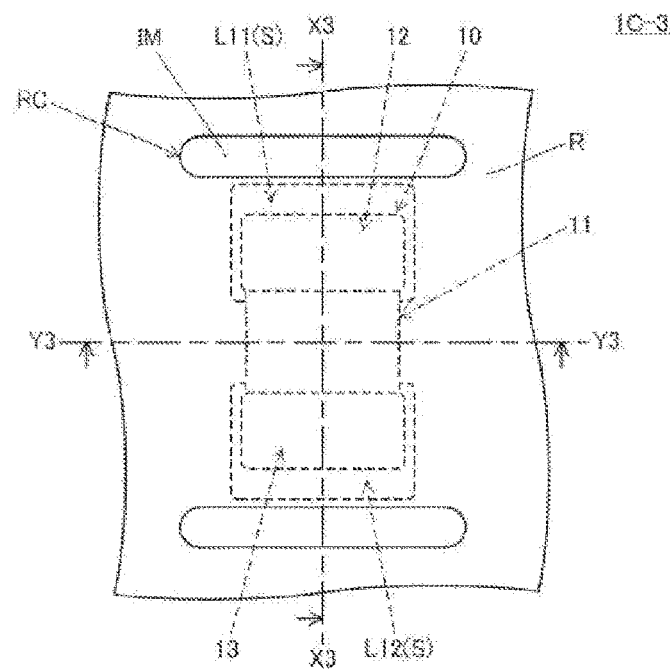
FIG. 41 is a top view of an electronic component containing substrate 1C-3 representing a third modification of electronic component containing substrate 1C shown in FIGS. 29 and 30.
Figure 42A:
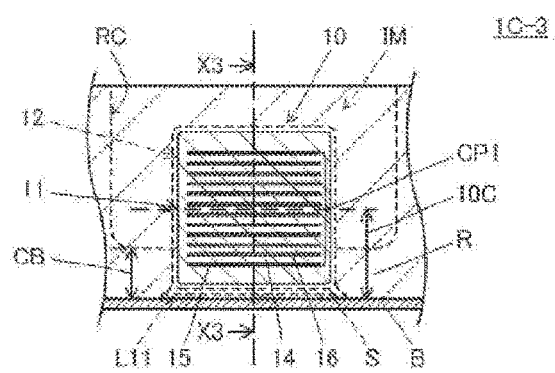
FIGS. 42A and 42B are cross-sectional views of an electronic component containing substrate 1C-3 shown in FIG. 41, with FIG. 42A showing a cross-sectional view along a surface including the line Y3-Y3 in FIG. 41 and FIG. 42B showing a cross-sectional view along a surface including the line X3-X3 in FIG. 41.
Figure 42B:
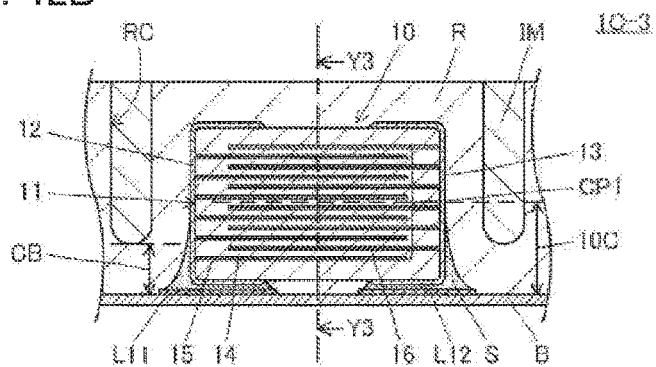

FIG. 41 is a top view of electronic component containing substrate 1C-3. FIG. 42A is a cross-sectional view along a surface including the line Y3-Y3 in FIG. 41. FIG. 42B is a cross-sectional view along a surface including the line X3-X3 in FIG. 41.

Electronic component containing substrate 1C-3 further includes in recess portion RC, an inserted member IM occupying at least a portion of a volume of recess portion RC. In FIGS. 41 and 42, recess portion RC is completely filled with inserted member IM. A material higher in elastic modulus than embedment layer R such as a resin, a metal, and ceramics is selected for inserted member IM. Inserted member IM is preferably at least two times higher in elastic modulus than embedment layer R.

With inserted member IM included in recess portion RC being higher in elastic modulus than embedment layer R, it is expected that a waveform of transmitted vibration of first electronic component 10 is disturbed at a portion of inserted member IM. Therefore, transmission of vibration of first electronic component 10 through embedment layer R is more effectively suppressed. Therefore, vibration of the electronic component containing substrate produced as a result of distortion in first electronic component 10 at the time of application of a voltage is reliably decreased and generation of audible sound is able to reliably be prevented or decreased.

Recess portion RC further includes in recess portion RC, another inserted member IM higher in elastic modulus than embedment layer R, so that a thickness of embedment layer R which has partially decreased can be close to a state that no recess portion RC is formed. Therefore, resistance to moisture or rigidity of the electronic component containing substrate is able to be improved from a state that recess portion RC is simply provided.

Fourth Modification of Fourth Preferred Embodiment

Electronic component containing substrates 1C-4 to 1C-6 representing fourth to sixth modifications of electronic component containing substrate 1C will be described with reference to FIG. 43. Though electronic component containing substrates 1C-4 and 1C-5 are different from electronic component containing substrate 1C-3 in position in recess portion RC where inserted member IM is provided, they are otherwise common thereto and hence description of a common portion will not be provided. Though electronic component containing substrate 1C-6 is different from electronic component containing substrate 1C-5 in further including a conductive layer CL, it is otherwise common thereto and hence description of a common portion will similarly not be provided.

Figure 43A:
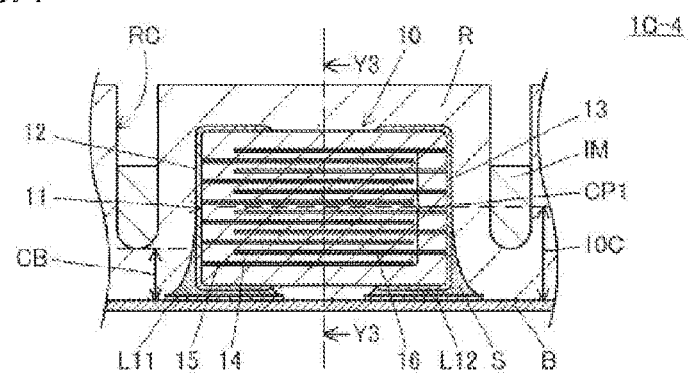
FIGS. 43A-43C are cross-sectional views of an electronic component containing substrates 1C-4 to 1C-6 representing fourth to sixth modifications of electronic component containing substrate 1C shown in FIGS. 29 and 30, with FIG. 43A showing electronic component containing substrate 1C-4, FIG. 43B showing an electronic component containing substrate 1C-5, and FIG. 43C showing electronic component containing substrate 1C-6.
Figure 43B:
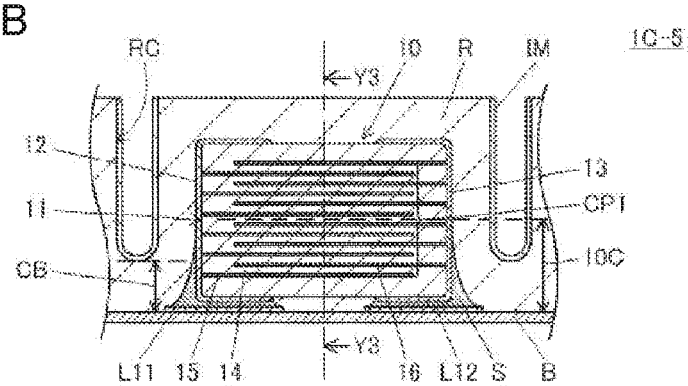
Figure 43C:
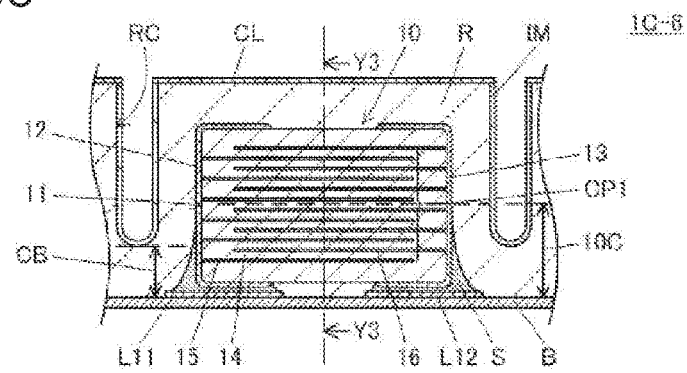

FIGS. 43A-43C are cross-sectional views corresponding to the cross-sectional view along the surface including the line X3-X3 in FIG. 41, of electronic component containing substrates 1C-4 to 1C-6.

FIG. 43A shows electronic component containing substrate 1C-4. In electronic component containing substrate 1C-4, inserted member IM is provided in recess portion RC in the vicinity of the center of layered portion CP1 of first electronic component 10. Inserted member IM does not have to be in contact with the bottom portion of recess portion RC. In this example, inserted member IM is included with attention being paid to a portion of first electronic component 10 where the first electronic component vibrates to the greatest extent at the time of application of a voltage. Therefore, when a metal and ceramics are used for inserted member IM, cost for manufacturing electronic component containing substrate 1C-4 can be reduced by decreasing a volume of inserted member IM.

FIG. 43B shows electronic component containing substrate 1C-5. In electronic component containing substrate 1C-5, inserted member IM is provided to cover an inner surface of recess portion RC. Similarly, inserted member IM does not have to be in contact with the bottom portion of recess portion RC. In this example, a most part of recess portion RC is maintained as a space. Therefore, an effect of suppression of transmission of vibration by providing a space by providing recess portion RC described in the first modification described previously and an effect of disturbance of a waveform of vibration by a portion of inserted member IM described in the third modification are able to both be achieved. Furthermore, when a metal and ceramics are used for inserted member IM, cost for manufacturing electronic component containing substrate 1C-5 is able to be reduced by decreasing a volume of inserted member IM.

FIG. 43C shows electronic component containing substrate 1C-6. In electronic component containing substrate 1C-6, conductive layer CL is formed on the surface of embedment layer R. Conductive layer CL is connected to a not-shown ground terminal included in substrate B. In this example, a high shielding effect can be obtained by connecting inserted member IM covering the inner surface of recess portion RC and conductive layer CL to each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component containing substrate comprising:
   a substrate;
   a first electronic component mounted on a main surface of the substrate; and
   an embedment layer provided on the main surface of the substrate and embedding the first electronic component;
   the first electronic component including a multilayer ceramic capacitor including a ceramic multilayer body including a layered portion including a ceramic dielectric layer and an internal electrode which are alternately layered and a first side portion and a second side portion between which the layered portion is located and including two end surfaces opposed to each other and side surfaces connecting the two end surfaces to each other and an external electrode connected to the internal electrode and provided on a surface of the ceramic multilayer body;
   the first side portion being located between the layered portion and the main surface of the substrate in a direction of thickness which is a direction perpendicular or substantially perpendicular to the main surface of the substrate; and
   the embedment layer being lower in elastic modulus than the substrate; wherein
   the electronic component containing substrate includes a central plane located at a position in the direction of thickness where the central plane passes through the ceramic multilayer body and portions above and under the central plane in the direction of thickness of the electronic component containing substrate mutually cancel vibrations.

2. The electronic component containing substrate according to claim 1, wherein in the direction of thickness, the first side portion of the ceramic multilayer body is greater in thickness than the second side portion.

3. The electronic component containing substrate according to claim 1, wherein
   the first electronic component includes an electrode terminal connected to the external electrode; and
   the electrode terminal is connected to the substrate.

4. The electronic component containing substrate according to claim 1, wherein
   the first electronic component further includes an interposer located between the first side portion and the substrate; and
   the interposer is connected to the substrate.

5. The electronic component containing substrate according to claim 1, wherein in the direction of thickness, the central plane of the electronic component containing substrate is located between a central plane of the layered portion of the first electronic component and the second side portion of the ceramic multilayer body.

6. The electronic component containing substrate according to claim 1, further comprising a second electronic component mounted on the main surface of the substrate and embedded in the embedment layer; wherein
   the second electronic component includes a multilayer ceramic capacitor including a ceramic multilayer body including a layered portion including a ceramic dielectric layer and an internal electrode which are alternately layered and a pair of side portions between which the layered portion lies and including two end surfaces opposed to each other and side surfaces connecting the two end surfaces to each other and an external electrode connected to the internal electrode and provided on a surface of the ceramic multilayer body;
   one of the side surfaces of the ceramic multilayer body of the first electronic component and one of the side surfaces of the ceramic multilayer body of the second electronic component are opposed to each other with the embedment layer being interposed;
   in the direction of thickness which is the direction perpendicular to the main surface of the substrate, an interval between a central plane of the layered portion of the first electronic component and the main surface of the substrate is greater than an interval between a central plane of the layered portion of the second electronic component and the main surface of the substrate; and
   in the direction of thickness, a central plane of the electronic component containing substrate is located between the central plane of the layered portion of the first electronic component and the central plane of the layered portion of the second electronic component.

7. The electronic component containing substrate according to claim 6, wherein in the direction of thickness, an interval between the central plane of the layered portion of the first electronic component and the central plane of the electronic component containing substrate is smaller than an interval between the central plane of the layered portion of the second electronic component and the central plane of the electronic component containing substrate.

8. The electronic component containing substrate according to claim 1, further comprising a second electronic component mounted on the main surface of the substrate and embedded in the embedment layer; wherein the second electronic component includes a multilayer ceramic capacitor including a ceramic multilayer body including a layered portion including a ceramic dielectric layer and an internal electrode which are alternately layered and a pair of side portions between which the layered portion lies and including two end surfaces opposed to each other and side surfaces connecting the two end surfaces to each other and an external electrode connected to the internal electrode and provided on a surface of the ceramic multilayer body;

one of the side surfaces of the ceramic multilayer body of the first electronic component and one of the side surfaces of the ceramic multilayer body of the second electronic component are opposed to each other with the embedment layer being interposed; and a direction of layering of the ceramic dielectric layer and the internal electrode in the ceramic multilayer body of the first electronic component is perpendicular or substantially perpendicular to a direction of layering of the ceramic dielectric layer and the internal electrode in the ceramic multilayer body of the second electronic component.

9. The electronic component containing substrate according to claim 8, wherein the first electronic component and the second electronic component are directly connected to each other through a conductive pattern.

10. The electronic component containing substrate according to claim 8, wherein with the main surface of the substrate being defined as a reference surface, a height of a center of the layered portion of the first electronic component is intermediate between a height of a lowest portion and a height of a highest portion of the layered portion of the second electronic component and a height of a center of the layered portion of the second electronic component is intermediate between a height of a lowest portion and a height of a highest portion of the layered portion of the first electronic component.

11. The electronic component containing substrate according to claim 1, wherein a surface of the embedment layer includes a recess portion.

12. The electronic component containing substrate according to claim 11, wherein the recess portion reduces vibration of the substrate which occurs with distortion in the first electronic component caused by application of a voltage in an audible frequency range.

13. The electronic component containing substrate according to claim 12, wherein the recess portion includes a lowest portion located lower than a center of the layered portion of the first electronic component, with the main surface of the substrate being defined as a reference surface.

14. The electronic component containing substrate according to claim 11, wherein the recess portion further includes an inserted member being higher in elastic modulus than the embedment layer and occupying at least a portion of a volume of the recess portion.

* * * * *